United States Patent
Nakano et al.

(10) Patent No.: US 10,622,786 B2
(45) Date of Patent: Apr. 14, 2020

(54) LASER APPARATUS AND RESERVOIR COMPUTING SYSTEM

(71) Applicant: INTERNATIONAL BUSINESS MACHINES CORPORATION, Armonk, NY (US)

(72) Inventors: Daiju Nakano, Kanagawa-ken (JP); Seiji Takeda, Tokyo (JP); Toshiyuki Yamane, Kanagawa-ken (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 96 days.

(21) Appl. No.: 15/492,400

(22) Filed: Apr. 20, 2017

(65) Prior Publication Data

US 2018/0309266 A1 Oct. 25, 2018

(51) Int. Cl.
| | | |
|---|---|---|
| *H01S 5/00* | (2006.01) | |
| *H01S 5/062* | (2006.01) | |
| *H01S 5/0683* | (2006.01) | |
| *H01S 5/12* | (2006.01) | |
| *H01S 5/022* | (2006.01) | |

(Continued)

(52) U.S. Cl.
CPC ....... *H01S 5/06223* (2013.01); *G06N 3/0445* (2013.01); *G06N 3/067* (2013.01); *G06N 3/08* (2013.01); *G06N 20/00* (2019.01); *H01S 5/021* (2013.01); *H01S 5/026* (2013.01); *H01S 5/02252* (2013.01); *H01S 5/02284* (2013.01); *H01S 5/0656* (2013.01); *H01S 5/0683* (2013.01); *H01S 5/1021* (2013.01); *H01S 5/1028* (2013.01); *H01S 5/1039* (2013.01);

(Continued)

(58) Field of Classification Search
CPC .... H01S 5/0683; H01S 5/021; H01S 5/02252; H01S 5/0656; H01S 5/12; H01S 5/142; H01S 5/1071; H01S 5/026; H01S 5/1039; H01S 5/1028; H01S 5/02284; H01S 5/1021; H01S 5/06223
See application file for complete search history.

(56) References Cited

U.S. PATENT DOCUMENTS

| | | | | |
|---|---|---|---|---|
| 6,393,185 B1 * | 5/2002 | Deacon | ............... | G02B 6/12004 385/12 |
| 6,934,313 B1 * | 8/2005 | Deacon | ................. | H01S 5/0607 372/39 |

(Continued)

OTHER PUBLICATIONS

Vandoorne, K. et al., "Photonic Reservoir Computing: A New Approach to Optical Information Processing" 12th International Conference on Transparent Optical Networks (Jun. 2010) pp. 1-4.

(Continued)

*Primary Examiner* — Kinam Park
(74) *Attorney, Agent, or Firm* — Tutunjian & Bitetto, P.C.; Vazken Alexanian

(57) ABSTRACT

To realize a reservoir computing system with a small size and reduced learning cost, provided is a laser apparatus including a laser; a feedback waveguide that is operable to feed light output from the laser back to the laser; an optical splitter that is provided in a path of the feedback waveguide and is operable to output a portion of light propagated in the feedback waveguide to outside; and a first ring resonator that is operable to be optically connected to the feedback waveguide, as well as a reservoir computing system including this laser apparatus.

12 Claims, 13 Drawing Sheets

(51) Int. Cl.
  *H01S 5/02*    (2006.01)
  *G06N 3/04*    (2006.01)
  *G06N 3/067*   (2006.01)
  *G06N 20/00*   (2019.01)
  *H01S 5/10*    (2006.01)
  *H01S 5/026*   (2006.01)
  *H01S 5/065*   (2006.01)
  *H01S 5/14*    (2006.01)
  *G06N 3/08*    (2006.01)

(52) U.S. Cl.
  CPC .............. *H01S 5/1071* (2013.01); *H01S 5/12* (2013.01); *H01S 5/142* (2013.01)

(56) References Cited

U.S. PATENT DOCUMENTS

| | | | |
|---|---|---|---|
| 7,106,448 B1* | 9/2006 | Vawter | G01C 19/72 356/461 |
| 7,650,080 B2* | 1/2010 | Yap | G02F 2/02 398/161 |
| 9,165,246 B2 | 10/2015 | Pickett | |
| 9,653,882 B1 | 5/2017 | Zheng et al. | |
| 9,755,753 B2 | 9/2017 | Blumenthal | |
| 9,929,535 B2 | 3/2018 | Chimot et al. | |
| 2010/0316074 A1* | 12/2010 | Fukuda | B82Y 20/00 372/43.01 |
| 2011/0122895 A1* | 5/2011 | Savage-Leuchs | H01S 3/06716 372/10 |
| 2015/0009548 A1 | 1/2015 | Bienstman et al. | |

OTHER PUBLICATIONS

Vandoorne, K. et al., "Experimental demonstration of reservoir computing on a silicon photonics chip" Nature Communications (Mar. 2014) pp. 1-6, vol. 5, No. 3541.

Vandoorne, K. et al., "Advances in Photonic Reservoir Computing on an Integrated Platform" 13th International Conference on Transparent Optical Networks (Jun. 2011) pp. 1-4.

Nguimdo, R.M. et al., "Fast photonic information processing using semiconductor lasers with delayed optical feedback: Role of phase dynamics" Optics Express (Apr. 2014) pp. 8672-8686, vol. 22, No. 7.

* cited by examiner

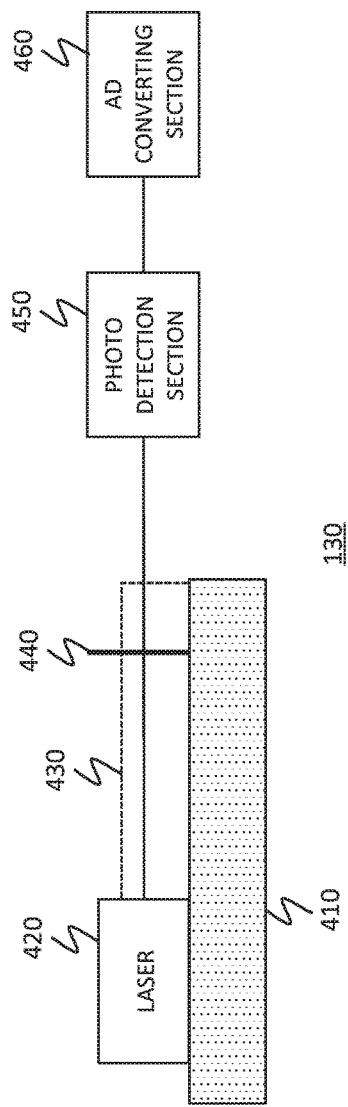
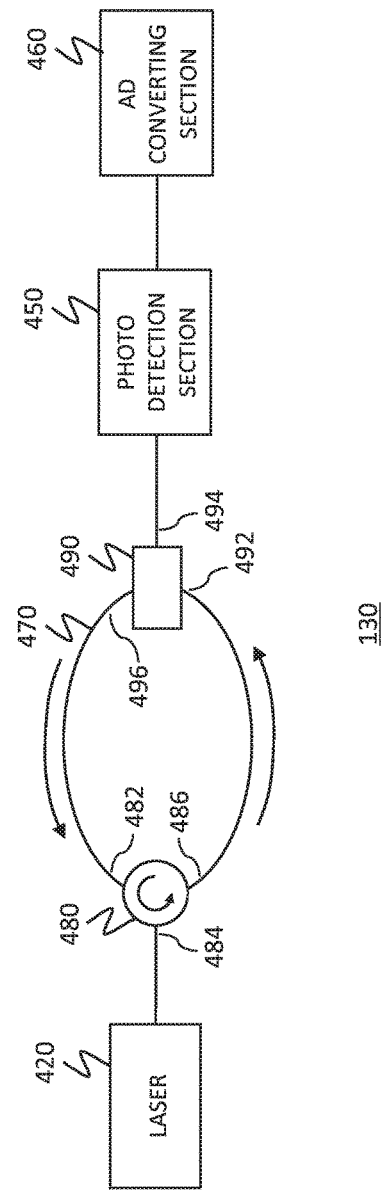

ered to as a reservoir is known as a learning method for handling time-series data, such as for voice recognition and securities predictions. Using a laser apparatus as the reservoir of such a reservoir computing system is also known.

LASER APPARATUS AND RESERVOIR COMPUTING SYSTEM

BACKGROUND

Technical Field

The present invention relates to a laser apparatus and a reservoir computing system.

Related Art

A reservoir computing system that uses a recurrent network structure referred to as a reservoir is known as a learning method for handling time-series data, such as for voice recognition and securities predictions. Using a laser apparatus as the reservoir of such a reservoir computing system is also known.

Such a reservoir computing system preferably uses the reservoir to propagate a signal component therein in a complex manner, in order to learn a complex input/output characteristic. It is known that the laser apparatus can realize a complex nonlinear input/output characteristic by using external feedback light obtained by lengthening the external propagation distance of the light. However, when the external propagation distance of the external feedback light of the laser apparatus is lengthened, the size of the laser apparatus is increased, and therefore it is difficult to realize a small-scale reservoir computing system.

SUMMARY

According to a first aspect of the present invention, provided is a laser apparatus comprising a laser; a feedback waveguide that is operable to feed light output from the laser back to the laser; an optical splitter that is provided in a path of the feedback waveguide and is operable to output a portion of light propagated in the feedback waveguide to outside; and a first ring resonator that is operable to be optically connected to the feedback waveguide, as well as a reservoir computing system comprising this laser apparatus.

The summary clause does not necessarily describe all necessary features of the embodiments of the present invention. The present invention may also be a sub-combination of the features described above.

BRIEF DESCRIPTION OF THE DRAWINGS

FIG. 8 shows a first exemplary configuration of the reservoir 130 according to the present embodiment.

FIG. 9 shows a second exemplary configuration of the reservoir 130 according to the present embodiment.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
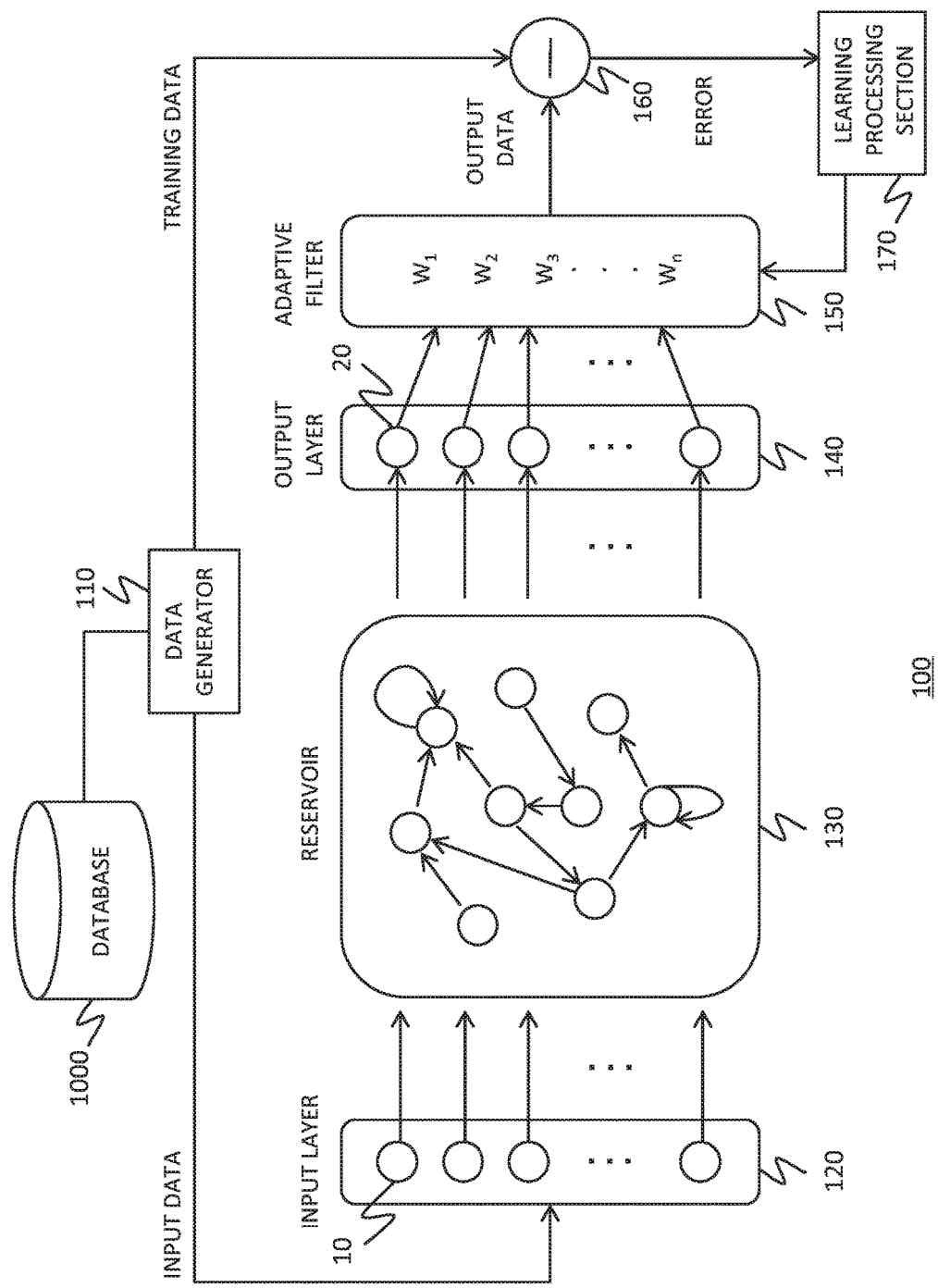
FIG. 1 shows an exemplary configuration of a reservoir computing system 100.

FIG. 1 shows an exemplary configuration of a reservoir computing system 100. The reservoir computing system 100 may be an apparatus that performs learning based on input data, output data, and training data. Furthermore, the reservoir computing system 100 may be operable to perform testing and make predictions for output data corresponding to the input data, based on the learning results. The reservoir computing system 100 adjusts weights in the system, in a manner to reduce the difference between output data that is output in response to the input data and training data corresponding to the input data. The reservoir computing system 100 includes a data generator 110, an input layer 120, a reservoir 130, an output layer 140, an adaptive filter 150, a comparing section 160, and a learning processing section 170.

The data generator 110 may be operable to generate the input data and supply the reservoir computing system 100 with the input data. If the reservoir computing system 100 is performing learning, the data generator 110 may generate training input data and training data corresponding to this input data, and supply the reservoir computing system 100 with this input data and training data. Furthermore, when the reservoir computing system 100 performs a test, makes a prediction, or the like based on learning results, the data generator 110 may generate input data for testing and supply the reservoir computing system 100 with this input data.

The data generator 110 is connected to an external database 1000 or the like, and may be operable to acquire the input data and the training data. Instead, the data generator 110 may generate the input data and the training data, using a predetermined algorithm or the like. The input data is a time-series data sequence in which a plurality of pieces of data are arranged according to the time axis, such as audio data, video data, or the like, for example. Furthermore, the training data may be expected output data that is expected for the input data.

The data generator 110 may read and acquire input data stored in a predetermined format. Furthermore, the data generator 110 may be connected to a network or the like and acquire input data and the like via this network. Instead of or in addition to this, the data generator 110 may be connected to an apparatus manipulated by a user, an apparatus (sensor) that detects and outputs time-series data, or the like, and acquire the time-series input data. The data generator 110 may store the acquired input data and the like in a storage apparatus or the like inside the reservoir computing system 100.

The input layer 120 may be operable to input the input data from the data generator 110. The input layer 120 may include one or more input nodes 10. The input data may be input to one or more corresponding input nodes 10. Each input node 10 may be operable to supply the reservoir 130 with an input signal corresponding to the input data. Each input node 10 may be operable to supply the input signal to one or more corresponding nodes of the reservoir 130. A weight may be set between each input node 10 and one or more corresponding nodes of the reservoir 130. Each input node 10 may supply an input signal that has been multiplied by the weight set for the input data to the one or more corresponding nodes.

The reservoir 130 may be operable to output an inherent output signal in response to the input signal. The reservoir 130 may have a network including a plurality of nodes. The reservoir 130 may have a recurrent type network structure. Each of the plurality of nodes of the reservoir 130 may be a nonlinear node that issues a nonlinear response to the input signal. The plurality of nodes of the reservoir 130 may be virtual nodes. In the network including the reservoir 130, each of the plurality of nodes may supply other corresponding nodes with a response signal corresponding to the input signal. In this case, each of the plurality of nodes may supply the other corresponding nodes with a weighted response signal.

The output layer 140 may be operable to output the response signal output by each node of the reservoir 130. The output layer 140 may include a plurality of output nodes 20. The output layer 140 preferably includes a number of output nodes 20 that is substantially the same as the number of nodes of the reservoir 130. For example, the plurality of output nodes 20 correspond one-to-one with the plurality of nodes of the reservoir 130. Each output node 20 may be operable to output an output value corresponding to the output signal output by the reservoir 130 in response to the input data. Each output node 20 may be operable to output to the adaptive filter 150 an output value of a corresponding node of the reservoir 130.

The adaptive filter 150 may be operable to output the output data based on the output value output from each output node 20. For example, the adaptive filter 150 applies weights corresponding respectively to the output value output by each output node 20, and outputs the result obtained by performing a predetermined calculation as the output data. As an example, the adaptive filter 150 outputs, as the output data, the sum of each of the weighted values of the output values of the output nodes 20. If the number of output nodes 20 is n, for example, the adaptive filter 150 outputs, as the output data, the sum $\Sigma w_n V_n$ of the values obtained by multiplying the n output values $V_n$ by the corresponding n weights ($w_1, w_2, \ldots, w_n$). The adaptive filter 150 may be operable to supply the comparing section 160 with the output data.

The comparing section 160 may be operable to compare the expected output data output by the data generator 110 to the output data output by the adaptive filter 150. For example, the comparing section 160 outputs the difference between the expected output data and the output data as an error. The comparing section 160 may supply the learning processing section 170 with this error as the comparison result.

Furthermore, the comparing section 160 may be operable to perform a comparison operation if the reservoir computing system 100 is learning. The comparing section 160 may be operable to, if the reservoir computing system 100 is performing a test or making a prediction using learning results, output the output data of the adaptive filter 150 to the outside as-is. In this case, the comparing section 160 may be operable to output the output data to an external output apparatus such as a display, a storage apparatus, and an external apparatus such as the database 1000.

The learning processing section 170 may be operable to set the plurality of weights of the adaptive filter 150 according to the comparison results of the comparing section 160. The learning processing section 170 may be operable to set the plurality of weights such that the reservoir computing system 100 outputs the output data that is expected in response to the input data. The learning processing section 170 may be operable to update the plurality of weights in a manner to further reduce the error between the output data output by the adaptive filter 150 in response to the training input data being supplied to the input node 10 and the expected output data that is expected for the training input data. The learning processing section 170 may be operable to operate if the reservoir computing system 100 is learning.

The reservoir computing system 100 described above may be a system capable of learning by updating the weights of the adaptive filter 150. Specifically, the reservoir computing system 100 may be operable to perform learning by updating the weights of the adaptive filter 150 while the weights between the input layer 120 and the reservoir 130 and the weights within the reservoir 130 are fixed at randomly determined initial values, for example.

Furthermore, by fixing the weights of the adaptive filter 150 at the learned weights and inputting input data for testing, the reservoir computing system 100 can output test results or prediction results for the input data for testing. Such a reservoir computing system 100 can simulate a learning operation and a testing operation by performing matrix calculations. Furthermore, if the reservoir computing system 100 is a physical device that outputs a nonlinear output signal in response to an input signal, the reservoir computing system 100 can be used as a reservoir 130, and is therefore expected to be a system with easy hardware installation.

However, if such a reservoir computing system 100 is actually implemented as physical systems, the output signals must be extracted from the plurality of nodes of the reservoir 130. However, it is difficult to extract the output signals from all of the nodes of the internal network of the reservoir 130. Furthermore, if the reservoir 130 uses virtual nodes, it is difficult to extract the output signals from the virtual nodes. Yet further, if a failure occurs in the attempt to extract the output signals from a portion of the nodes of the reservoir 130, even if the reservoir 130 operates correctly it is impossible to accurately perform the learning, testing, and the like if this failure is not resolved.

Therefore, the reservoir computing system according to the present embodiment performs the learning, predicting, and the like based on the output signals of a portion of the nodes of the reservoir 130. The following describes such a reservoir computing system.

Figure 2:
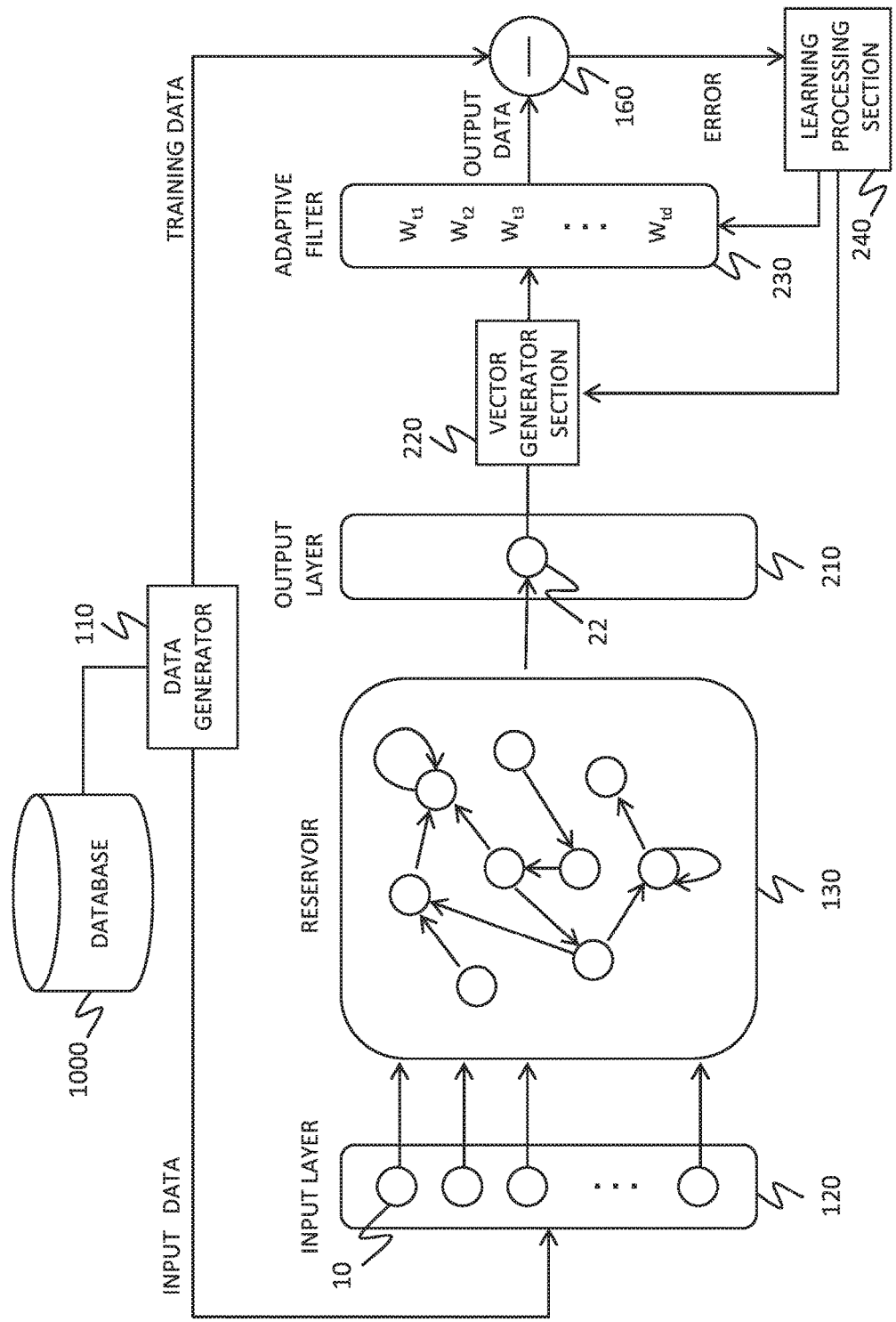
FIG. 2 shows an exemplary configuration of a reservoir computing system 200 according to the present embodiment.

FIG. 2 shows an exemplary configuration of a reservoir computing system 200 according to the present embodiment. In the reservoir computing system 200 according to the present embodiment, components having substantially the same operation as components of the reservoir computing system 100 shown in FIG. 1 are given the same reference numerals and descriptions thereof are omitted. The reservoir computing system 200 according to the present embodiment includes the data generator 110, the input layer 120, the reservoir 130, an output layer 210, a vector generator section 220, an adaptive filter 230, and a learning processing section 240.

The output layer 210 may be operable to output response signals that are output by a portion of the plurality of nodes of the reservoir 130. The output layer 210 may include one or more output nodes 22. The output layer 210 may include a number of output nodes 22 that is less than the number of nodes of the reservoir 130. In other words, only some of the nodes among the plurality of nodes of the reservoir 130 are connected to output nodes 22.

FIG. 2 shows an example in which the output layer 210 includes one output node 22, and only one node among the plurality of nodes of the reservoir 130 is connected to the output node 22. The output node 22 may be operable to output an output value corresponding to an output signal output by the reservoir 130 in response to the input data. The output node 22 may be operable to output the output value of the corresponding node of the reservoir 130 to the vector generator section 220.

The vector generator section 220 may be operable to generate a multidimensional vector based on the output value output from the one output node 22 and a plurality of timings. The vector generator section 220 may be operable to generate a d-dimensional delay coordinate vector based on one-dimensional time-series data and d timings. In this case, the vector generator section 220 may generate d data sequences.

Here, if the time-series data is a continuous value, the time difference between temporally adjacent timings among the plurality of timings is an interval T. Specifically, if the time-series data is a continuous value, the vector generator section 220 may generate the d-dimensional delay coordinate vector with d timings at intervals T. If the time-series data is a digital value, the vector generator section 220 may generate the d-dimensional delay coordinate vector with d timings corresponding to the clock period.

If n is the degree of freedom of the reservoir 130, i.e. the number of nodes in the reservoir 130, the vector generator section 220 may generate a d-dimensional delay coordinate vector in which d is greater than n. In this case, the vector generator section 220 preferable generates a d-dimensional delay coordinate vector in which d is greater than 2n. If the output layer 210 includes a plurality of output nodes 22, the vector generator section 220 may generate a delay coordinate vector for each output node 22. The vector generator section 220 supplies the adaptive filter 230 with the generated delay coordinate vectors.

The adaptive filter 230 may be operable to output output data based on results obtained by weighting a plurality of output values output from the output node 22 at a plurality of timings with a plurality of weights. The adaptive filter 230 may use a plurality of weights corresponding to the dimensions d of the delay coordinate vector. For example, for each of the d data sequences, the adaptive filter 230 may weight this data sequence using d weights.

The adaptive filter 230 may generate and output the output data from the weighted d-dimensional delay coordinate vector. The adaptive filter 230 may be operable to supply the comparing section 160 with the output data. If the reservoir computing system 200 is learning, the comparing section 160 may supply the learning processing section 240 with the difference between the expected output data and the output data as the error. Furthermore, the comparing section 160 may be operable to, if the reservoir computing system 100 is performing a test or making a prediction using the learning results, output the output data of the adaptive filter 150 to the outside as-is.

The learning processing section 240 may be operable to set the plurality of weights of the adaptive filter 150 according to the comparison results of the comparing section 160. The learning processing section 240 may be operable to set the plurality of weights such that the output data expected for the input data is output by the reservoir computing system 200. The learning processing section 240 may be operable to update the plurality of weights in a manner to reduce the error between the output data output by the adaptive filter 230 in response to the training input data being supplied to the input nodes 10 and the expected output data that is expected for the training input data. The learning processing section 240 may be operable to operate if the reservoir computing system 100 is performing learning.

Furthermore, the learning processing section 240 may be operable to adjust at least a portion of the parameters for generation of the delay coordinate vector by the adaptive filter 230. The learning processing section 240 may be operable to, if the time-series data is a continuous value, adjust one or both of the number of dimensions d and the interval T. Furthermore, the learning processing section 240 may be operable to, if the time-series data is a digital value, adjust the number of dimensions d.

In the manner described above, the reservoir computing system 200 may be a system capable of learning based on the output values and the expected output data of a portion of the nodes among the plurality of nodes of the reservoir 130. The following describes the operation of such a reservoir computing system 200.

Figure 3:
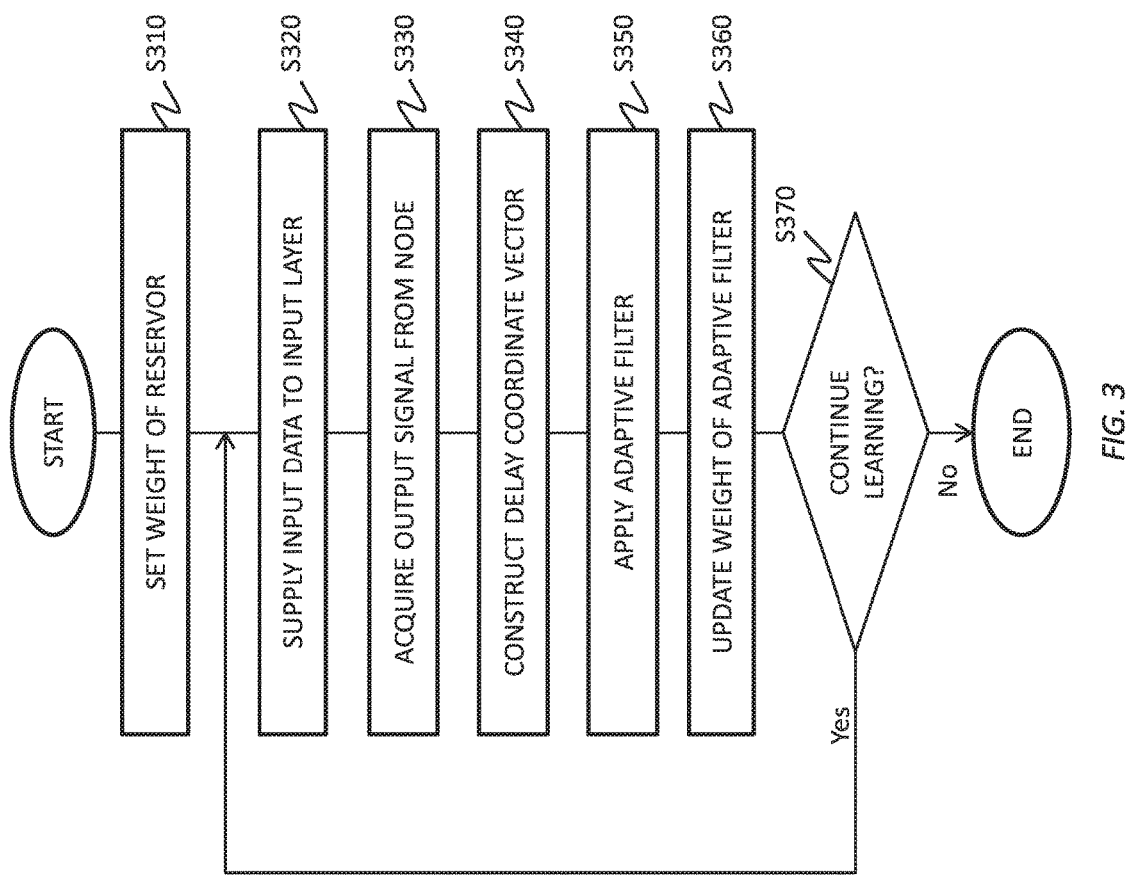
FIG. 3 shows an exemplary operational flow of the reservoir computing system 200 according to the present embodiment.

FIG. 3 shows an exemplary operational flow of the reservoir computing system 200 according to the present embodiment. In the present embodiment, the reservoir computing system 200 may be operable to perform learning by performing the processes from S310 to S370.

First, at S310, the weights of the reservoir 130 may be initially set. The reservoir computing system 200 may perform initial setting of the weights between the input layer 120 and the reservoir 130 and of the weights inside the reservoir 130. The weights between the input layer 120 and the reservoir 130 and of the weights inside the reservoir 130 may be determined using random numbers. The weights between the input layer 120 and the reservoir 130 and of the weights inside the reservoir 130 do not need to change according to learning performed after being determined once.

Next, at S320, the input data may be supplied to the input layer 120. The data generator 110 may supply the input layer 120 with the training input data generated by the data generator 110. Here, the data generator 110 may generate the expected output data corresponding to the training input data supplied to the input layer 120 and supply this expected output data to the comparing section 160.

Next, at S330, the output layer 210 may acquire the output signals output by a portion of the nodes of the reservoir 130. In the present embodiment, an example is described in which the output layer 210 includes one output node 22 and acquires the output signal of one node among the plurality of nodes of the reservoir 130.

Next, at S340 the vector generator section 220 may generate the d-dimensional delay coordinate vector. Here, if the time-series data is a continuous value, the vector generator section 220 may generate the delay coordinate vector using d timings and the parameter of the interval T between the timings, as shown in the following expression. Here, x(t) is one-dimensional time-series data output from the one output node 22.

$$x(t), t \in \mathbb{R} \to \{x(t), x(t-T), \ldots, x(t-(d-1)T)\} \in \mathbb{R}^d \quad \text{Expression 1:}$$

Furthermore, if the time-series data is a digital value, the vector generator section 220 may generate the delay coordinate vector using d timings, as shown in the following expression.

$$x(n), n \in \mathbb{N} \to \{x(n), x(n-1), \ldots, x(n-(d-1))\} \in \mathbb{R}^d \quad \text{Expression 2:}$$

Next, at S350, the adaptive filter 230 may generate and output the output data by applying the weights to the delay coordinate vector. For example, the adaptive filter 230 may multiply the d data sequences respectively by d corresponding weights ($w_{t1}, w_{t2}, \ldots w_{td}$). Furthermore, the adaptive filter 230 may output, as the output data, the weighted delay coordinate vector configured as one-dimensional time-series data. Specifically, the adaptive filter 230 may calculate the dot product of the delay coordinate vector and a weight vector ($w_{t1}, w_{t2}, \ldots w_{td}$) having d weights as elements.

Next, at S360, the learning processing section 240 may update the weights of the adaptive filter 230. The learning processing section 240 may update the d weights in a manner to reduce the error between the expected output data and the output data. The learning processing section 240 may update the weights of the adaptive filter 230 such that the output data becomes closer to the expected output data, using the least squares method. In this case, the learning processing section 240 may update the d weights using a linear filter.

Furthermore, the learning processing section 240 may update the weights of the adaptive filter 230 in a manner to minimize the square error. In this case, the learning processing section 240 may update the d weights using a Wiener filter.

If the learning is to continue (S370: Yes), the reservoir computing system 200 may return to step S320 and perform the next learning using the next training input data and expected output data. The reservoir computing system 200 may repeat the update of the weights of the adaptive filter 230 a predetermined number of times to determine these weights. If the difference in the value before the weight update and after the weight update is greater than or equal to a predetermined threshold value even after the update of the weights of the adaptive filter 230 has been performed the predetermined number of times, the learning processing section 240 may stop the learning and notify the user that the weights do not converge.

If the learning is to end (S370: No), the reservoir computing system 200 may determine the weights of the adaptive filter 230 to be the most recently updated weights. The reservoir computing system 200 may store the determined weights in an internal storage section and/or an external database 1000 or the like. In the manner described above, the reservoir computing system 200 may complete the learning operation.

By applying the determined weights to the adaptive filter 230 and inputting testing input data, the reservoir computing system 200 can output test results or prediction results for this testing input data. The following describes the input data and the delay coordinate vector of such a reservoir computing system 200.

Figure 4:
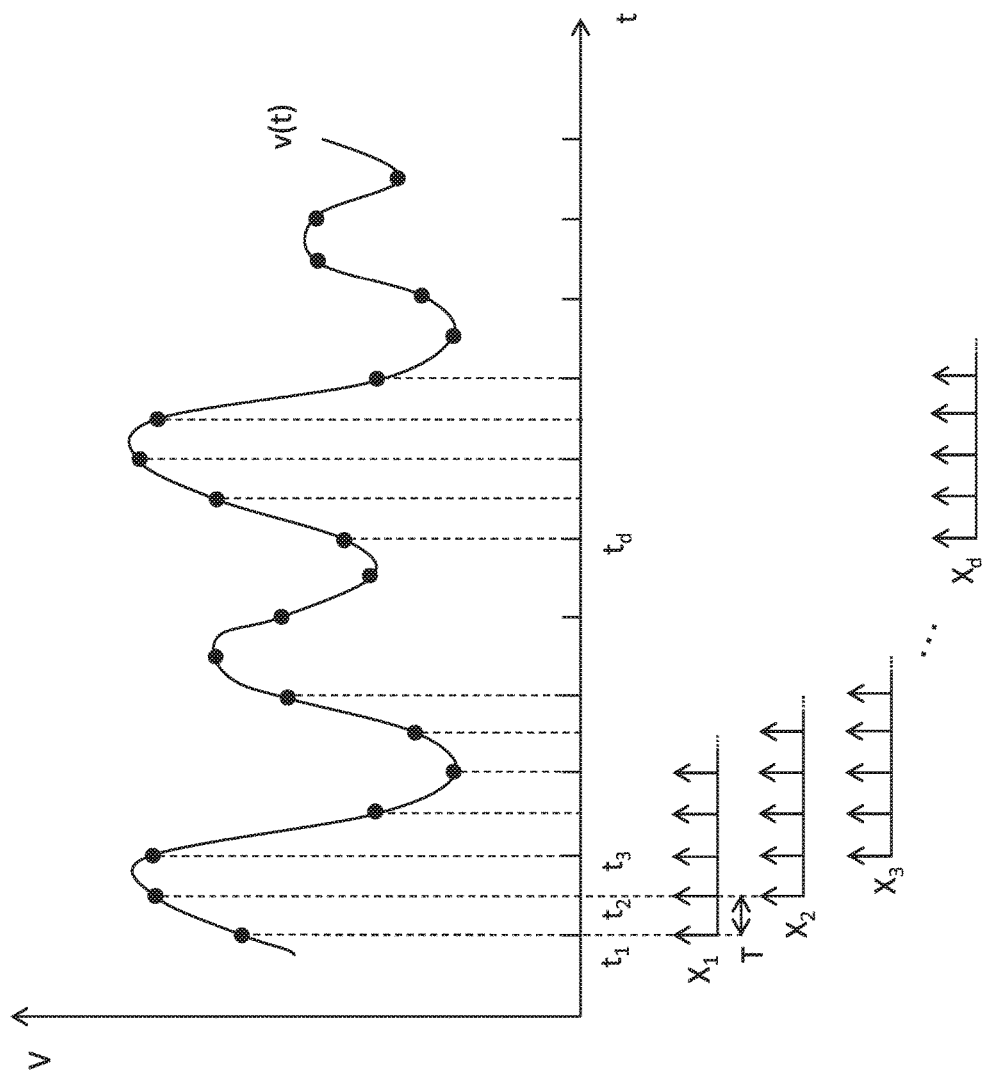
FIG. 4 shows an exemplary delay coordinate vector generated by the vector generator section 220 according to the present embodiment.

FIG. 4 shows an exemplary delay coordinate vector generated by the vector generator section 220 according to the present embodiment. FIG. 4 shows an example in a case where the input data is a continuous value. In FIG. 4, the horizontal axis indicates time t and the vertical axis indicates the signal strength V. The curve v(t) shows an example of the input data.

The vector generator section 220 may set a data sequence $X_1$ having a signal strength $v(t_m)$ at the time $t_m$ at every interval T from the signal strength $v(t_1)$ at the timing $t_1$ as the first vector element of the delay coordinate vector. Furthermore, the vector generator section 220 may set a data sequence $X_2$ having a signal strength $v(t_m)$ at the time $t_m$ at every interval T from the signal strength $v(t_2)$ at the timing $t_2$ as the second vector element of the delay coordinate vector. In the same manner, the vector generator section 220 may extract data sequences up to the data sequence $X_d$ of the d vector elements and set these data sequences from the data sequence $X_1$ to the data sequence $X_d$ as the delay coordinate vector.

In this case, the adaptive filter 230 may calculate the data sequence $w_{t1}X_1$ by multiplying each piece of data in the data sequence $X_1$ by the weight $w_{t1}$. In the same manner, the adaptive filter 230 may calculate the data sequences $w_{t1}X_1$, $w_{t2}X_2, \ldots w_{t3}X_3$ by multiplying each piece of data in each of the data sequences from the data sequence $X_2$ to the data sequence $X_d$ by the corresponding weights from $w_{t2}$ to $w_{td}$.

The adaptive filter 230 may then calculate the data sequence $w_{t1}X_1$ at the timing $t_1$ and calculate the data sequence $w_{t2}X_2$ at the timing $t_2$. Here, among the pieces of data of the data sequence $w_{t1}X_1$ and the data sequence $w_{t2}X_2$, pieces of data with the same timings may be added together. In the same manner, the adaptive filter 230 may calculate each data sequence from the data sequence $w_{t3}X_3$ to the data sequence $w_{td}X_d$ corresponding to the timings from the timing $t_3$ to the timing $t_d$, and output the generated time-series data as the output data.

FIG. 4 shows an example in which the input data is a continuous value, but instead the input data may be a digital signal expressed by a signal strength $v(t_1+(m-1)T_c)$ with a constant clock period $T_c$. In this case, in the same manner as in the example where the input data is a continuous value, the vector generator section 220 may set the data sequence $X_1$ from the signal strength $v(t_1)$ at the timing $t_1$ as the first vector element of the delay coordinate vector. Furthermore, the vector generator section 220 may set the data sequence $X_2$ from the timing $t_2=t_1+T_c$ as the second vector element of the delay coordinate vector.

In the same manner, the vector generator section 220 may extract the data sequences up to the data sequence $X_d$ of the d-th vector element and set the data sequences from the data sequence $X_1$ to the data sequence $X_d$ as the delay coordinate vector. In this case, the interval T may be substantially equal to the clock period $T_c$. In this way, regardless of whether the input data is a continuous value or a digital value, the adaptive filter 230 can output the output data using the same operation.

An "Embedding Theorem" according to Takens is known as a technique for investigating a dynamics model, if the structure of the dynamics model is unknown, by performing a reconfiguration using the time delay coordinates corresponding to the time-series data that has actually been measured. The reservoir computing system 200 uses such an embedding theorem, and therefore can perform the learning and testing operations corresponding to the state of the reservoir 130 without using the output values of all of the nodes of the reservoir 130.

Figure 5:
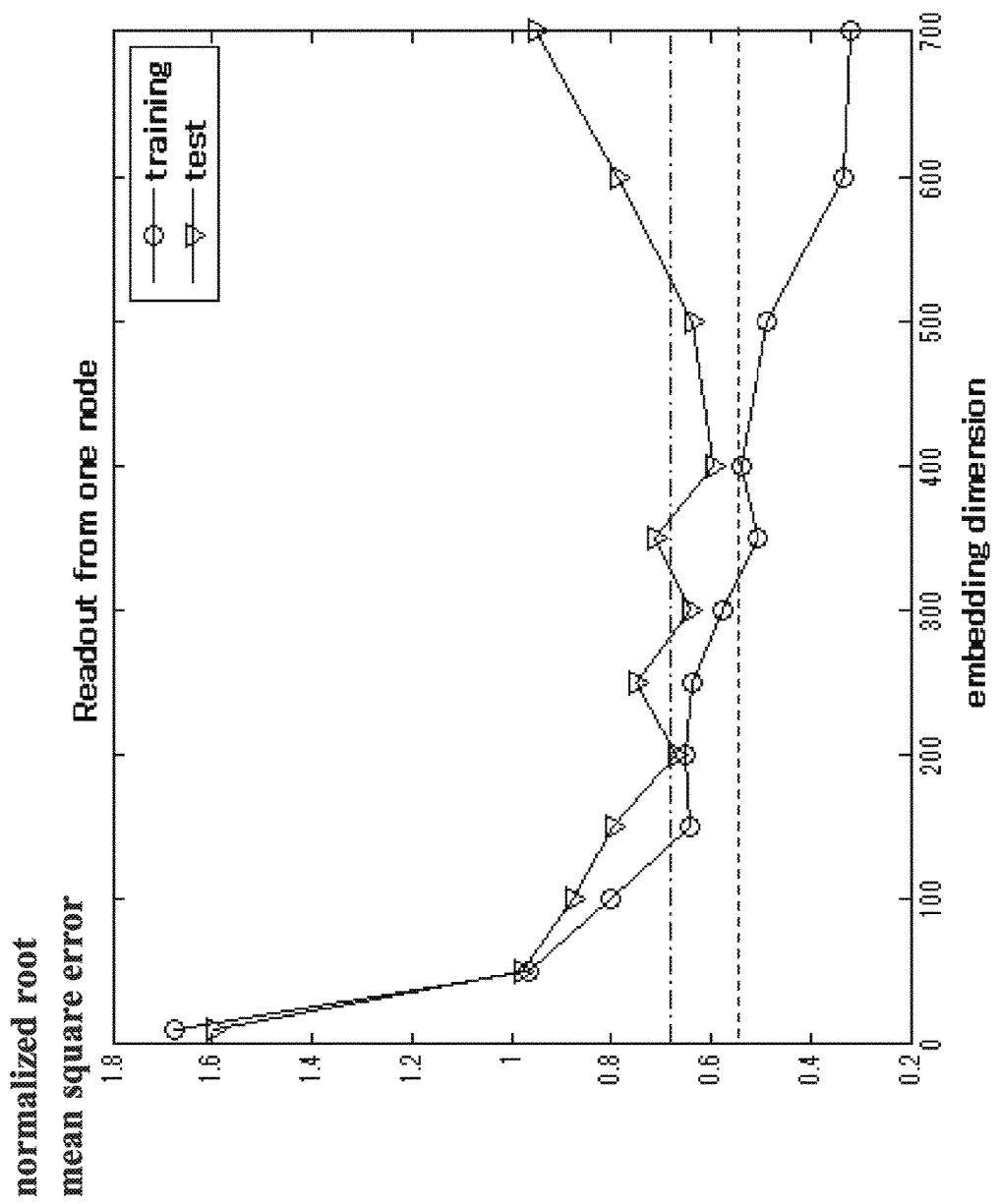
FIG. 5 shows exemplary learning results of the reservoir computing system 200 according to the present embodiment described above.

FIG. 5 shows exemplary learning results of the reservoir computing system 200 according to the present embodiment described above. FIG. 5 shows the steps by which the reservoir computing system 200 further adjusts the parameter d used by the vector generator section 220. In FIG. 5, the horizontal axis indicates the dimensions d of the delay coordinate vector. In FIG. 5, the vertical axis indicates the evaluation value of the error. The evaluation value of the error is the normalized root mean square error, and is abbreviated as NRMSE. The NRMSE is expressed as shown in the following expression.

$$NRMSE = \sqrt{\frac{\langle (y - y')^2 \rangle}{\langle (y - \langle y \rangle)^2 \rangle}} \qquad \text{Expression 3}$$

In Expression 3, the expected output data, which is the training data, is y, and the output data is y'. Specifically, the denominator in Expression 3 indicates the standard deviation of the expected output data y, and the numerator indicates the expected value of the square of the error y-y'. The evaluation value NRMSE indicates that the learning is effective if the value is smaller than 1 and indicates that the effect of the learning is higher when this value is closer to 0. Specifically, the evaluation value NRMSE is an evaluation value that approaches 0 as the error y-y' becomes smaller.

FIG. 5 shows an example of results obtained by the reservoir computing system 200 learning an Echo Stat Network as shown by the following expression.

$$x(n+1) = \tanh(W_{res}x(n) + W_{in}u(n)) \qquad \text{Expression 4}$$
$$y'(n) = W\_out x(n)$$
$$y(n) = 0.3y(n-1) +$$
$$0.05y(n-1)\sum_{i=1}^{10} y(n-i) + 1.5u(n-1)u(n-10) + 0.1$$

Here, u(n) represents the input data input to the input node 10, x(n) represents reservoir state vector corresponding to the input data, and y' (n) represents the output data. Furthermore, $W_{in}$ represents the coupled matrix between the input node 10 and the reservoir 130, $W_{res}$ represents the coupled matrix inside the reservoir 130, and $W_{out}$ represents the coupled matrix between the reservoir 130 and the output node 22. Yet further, $W_{res}$ may be a sparse matrix with a connectivity of approximately 0.3, for example.

In addition, y(n) represents the expected output data. The expected output data y(n) in Expression 4 is a model that is known as a NARMA (10) model used as a benchmark in reservoir computing. Here, NARMA is an abbreviation for Nonlinear Auto Recursive Moving Average.

FIG. 5 shows an example of results obtained by the reservoir computing system 200 learning the NARMA (10) model for every dimension d of the delay coordinate vector using the reservoir 130 including 100 nodes therein. The circle marks plotted in FIG. 5 indicate learning results of the reservoir computing system 200. Furthermore, the triangular marks plotted in FIG. 5 indicate results of a test using the learning results.

FIG. 5 uses a dotted line to show the learning results of the reservoir computing system 100 using the output data from all of the output nodes 20, as described in FIG. 1, for comparison. The single-dash line indicates the test results obtained using the learning results of the reservoir computing system 100. Since the reservoir computing system 100 using all of the output nodes 20 does not use a delay coordinate vector, the learning results and test results are substantially constant values that are unrelated to the value d of the horizontal axis.

From FIG. 5, it is understood that if the number of dimensions is less than or equal to 100, which is the number of nodes in the reservoir 130, the performance enters "under-fitting" territory where the reservoir computing system 200 does not have an effect despite performing the learning. It is also understood that if the number of dimensions d of the delay coordinate vector exceeds approximately twice the number of nodes (100) of the reservoir 130, the reservoir computing system 200 can perform learning with high accuracy. Yet further, it is understood that if the number of dimensions d of the delay coordinate vector exceeds approximately 500, the reservoir computing system 200 enters into "over-fitting" territory.

Accordingly, the learning processing section 240 may be operable to adjust the number of timings among the plurality of timings, i.e. the number of dimensions d, in a manner to further decrease the error. The learning processing section 240 may be operable to compare the learning results corresponding to the plurality of dimensions d and set a suitable number of dimensions d, as shown in the example of FIG. 5. Furthermore, the learning processing section 240 may be operable to also adjust the interval T between the plurality of timings. The learning processing section 240 may be operable to compare the learning results for a plurality of intervals T and set a suitable interval T, as shown in the example of FIG. 5. The learning processing section 240 may be operable to adjust at least one of the number of dimensions d and the interval T.

The learning processing section 240 may be operable to adjust at least one of the number of timings among the plurality of timings and the interval T between the plurality of timings, using cross-validation. Specifically, the learning processing section 240 may perform learning using a portion of a plurality of groups of input data and expected output data corresponding to this input data. The learning processing section 240 may perform testing of the remaining groups using the learning results, and calculate the evaluation value NRMSE according to the error between the output data and the expected output data. FIG. 5 shows an example of evaluation results obtained by the learning processing section 240 using such cross-validation.

In the manner described above, the reservoir computing system 200 according to the present embodiment can perform learning by using the output of a portion of the plurality of nodes of the reservoir 130 to generate a delay coordinate vector from output values at a plurality of timings. If many types of input/output data are to be learned accurately, there is an idea to increase the number of nodes in the reservoir 130 and create a more complex system. In this case, it becomes even more difficult to reliably connect to all of the output nodes and extract the output data.

However, the reservoir computing system 200 according to the present embodiment can restrict the increase in the number of connections to output nodes and perform learning by increasing the number of dimensions d, and can therefore easily adapt to a complex reservoir 130. Furthermore, since learning is possible with just a small amount of an increase in the number of dimensions d of the reservoir computing system 200, e.g. from the total number of nodes to twice the total number of nodes, learning can be performed without significantly increasing the amount of calculations.

Figure 6:
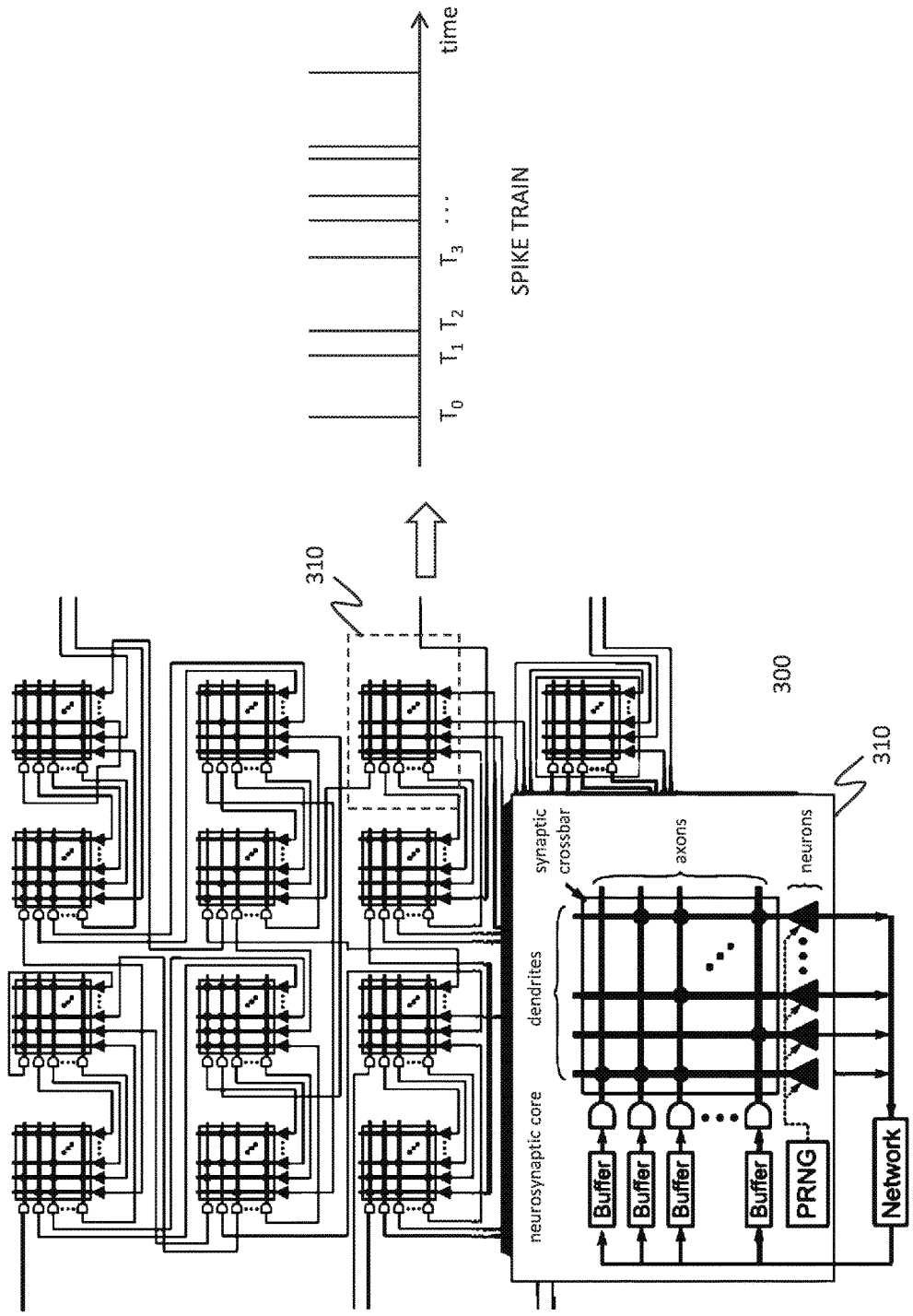
FIG. 6 shows an example of a spike neuron model used by the reservoir computing system 200 according to the present embodiment.

The reservoir computing system 200 according to the present embodiment described above may use a spike neural network or the like as the reservoir 130. FIG. 6 shows an example of a spike neuron model used by the reservoir computing system 200 according to the present embodiment. FIG. 6 shows neuromorphic hardware 300 based on the spike neuron model.

The neuromorphic hardware 300 may include a plurality of neuron devices 310. Each neuron device 310 may be electrically connected to an external signal generating section and one or more other neuron devices 310, and receive an input signal that changes over time. Each neuron device 310 may output a spiked output signal to the one or more other neuron devices 310, according to the input pattern of a plurality of input signals. Such neuromorphic hardware 300 may be configured as a liquid state machine.

The reservoir computing system 200 according to the present embodiment may use such neuromorphic hardware 300 as the reservoir 130. Specifically, the plurality of the input nodes 10 in the input layer 120 are each connected to a corresponding neuron device 310. Furthermore, one or more output nodes 22 are connected to a portion of the neuron devices 310 among the plurality of neuron devices 310. For example, one output node 22 receives a spiking train from one neuron device 310, as shown in FIG. 6.

Here, the one output node 22 may be operable to output, as the output value, a value $(T_1-T_0, T_2-T_1, \ldots, T_d-T_{d-1})$ representing the spike interval of the output signal output by the reservoir 130. The output node 22 may supply the vector generator section 220 with such inter-spike intervals. The vector generator section 220 may generate the d-dimensional delay coordinate vector by performing the same operation as used for a digital signal on the inter-spike intervals $(T_1-T_0, T_2-T_1, \ldots, T_d-T_{d-1})$. In this way, the reservoir computing system 200 according to the present embodiment can use a spike neural network or the like as the reservoir 130.

The reservoir computing system 200 described above can performing learning, testing, and the like as long as it is possible to acquire an output signal from a portion of the nodes among the plurality of nodes in the reservoir 130. Accordingly, the reservoir 130 does not need to form all of the nodes as physical nodes. In this case, the reservoir 130 may be a device having a fine structure or the like. The reservoir 130 may be a device forming a spin system, a propagation system for surface acoustic waves, a microwave conducting system, or the like. Furthermore, the reservoir 130 may be a device that includes a ferromagnetic material, a phase change material, or the like.

The reservoir 130 may use an input/output response of such a device. Specifically, the reservoir 130 may be a physical reservoir that outputs an electrical, magnetic, optical, mechanical, thermal, or acoustic output signal in response to an electrical, magnetic, optical, mechanical, thermal, or acoustic input signal. The physical reservoir may include a metal layer, a ferroelectric layer, a ferromagnetic layer, a phase change material layer, and/or the like formed on a substrate.

The physical reservoir may receive an input signal from one or more input sections and propagate the input signal therein. By propagating the input signal therein in a plurality of directions, the physical reservoir may change the signal components in a complex manner and operate as a plurality of virtual nodes. The physical reservoir may output an output signal from an output section according to the input signal being propagated in one or more output sections or according to the effect of the input signal. Even if the reservoir computing system 200 is such a physical reservoir, there is no need to exchange signals with virtual nodes, and therefore the physical reservoir can be used as the reservoir 130 by using signal input sections and output sections along with the signals.

Here, if output signals are received from m output sections of the reservoir 130, for example, m output nodes 22 may respectively receive corresponding output signals. The vector generator section 220 may generate $d_1, d_2, \ldots, d_m$-dimensional delay coordinate vectors for each of the m output signals $x_1(t), x_2(t), \ldots, x_m(t)$, for example, as shown in the following expression. As shown in Expression 5, the reservoir computing system 200 may generate $d_1+d_2+\ldots+d_m$-dimensional delay coordinate vectors.

Expression 5

$$x_1(t) \rightarrow \{x_1(t), x_1(t-T), \ldots, x_1(t-(d_1-1)T)\}$$
$$x_2(t) \rightarrow \{x_2(t), x_2(t-T), \ldots, x_2(t-(d_2-1)T)\}$$
$$\vdots$$
$$x_m(t) \rightarrow \{x_m(t), x_m(t-T), \ldots, x_m(t-(d_m-1)T)\} \rightarrow$$
$$(x_1(t), \ldots, x_1(t-(d_1-1)T), x_2(t), \ldots, x_2(t-(d_2-1)T), \ldots,$$
$$, \ldots, x_m(t), \ldots, x_m(t-(d_m-1)T))$$

Figure 7:
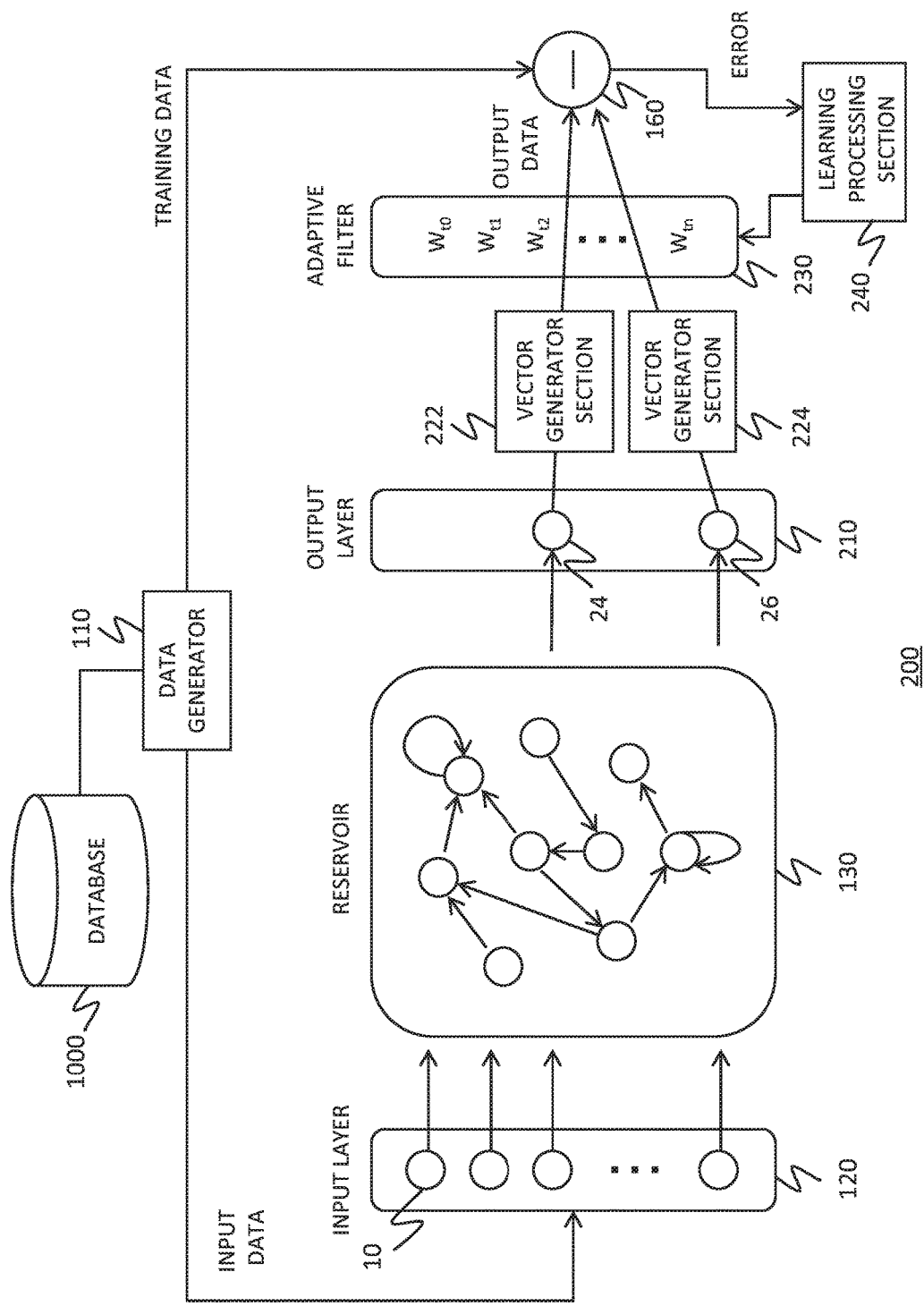
FIG. 7 shows a modification of the reservoir computing system 200 according to the present embodiment.

The reservoir computing system 200 according to the present example described above may include a plurality of output nodes, in order to account for connection failure of the output nodes. Such a reservoir computing system 200 is described using FIG. 7. FIG. 7 shows a modification of the reservoir computing system 200 according to the present embodiment. In the reservoir computing system 200 according to the present modification, components having substantially the same operation as components of the reservoir computing system 200 shown in FIG. 2 are given the same reference numerals and descriptions thereof are omitted.

The reservoir computing system 200 according to the present modification further includes a first output node 24, a second output node 26, a first vector generator section 222, and a second vector generator section 224. The first output node 24 may be connected to a first node among the plurality of nodes of the reservoir 130. The second output node 26 may be connected to a second node among the plurality of nodes of the reservoir 130.

The first vector generator section 222 may be operable to generate the delay coordinate vector, according to the output value from the first output node 24. The second vector generator section 224 may be operable to generate the delay coordinate vector according to the output value from the second output node 26. The adaptive filter 230 may be operable to weight the delay coordinate vector received from the first vector generator section 222 or the second vector generator section 224, and output the result as the output data. In this case, the learning processing section 240 may update different weights for each path as the learning results.

Here, the adaptive filter 230 may be operable to output the output data based on a plurality of output values received by the second output node 26, in response to the path leading to the adaptive filter 230 from the reservoir 130 via the first output node 24 failing. In other words, the reservoir computing system 200 of the present includes a plurality of paths that are each capable of learning independently, and may be operable to perform the learning, testing, or the like using paths that are undamaged among the plurality of paths. In this way, if the reservoir computing system 200 is actually implemented as a hardware device, the reservoir computing system 200 can operate by using other paths when a wiring failure or the like occurs in one of the paths, and can improve the lifespan of the system.

Furthermore, if a plurality of paths are included, the reservoir computing system 200 may be operable to perform the learning, testing, and the like using the plurality of paths. In this case, the output layer 210 may include two or more output nodes connected respectively to two or more nodes among the plurality of nodes of the reservoir 130.

Furthermore, the reservoir computing system 200 may include a plurality of vector generator sections corresponding to the plurality of output nodes. Instead, the reservoir computing system 200 may include one vector generator section, and this one vector generator section may generate a plurality of delay coordinate vectors corresponding respectively to the plurality of output nodes. One or more vector generator sections may generate $d_1, d_2, \ldots, d_m$-dimensional delay coordinate vectors as shown by Expression 5.

The adaptive filter 230 may be operable to output the output data based on results obtained by weighting the plurality of output values output from two or more output nodes at a plurality of timings using a plurality of weights. In this way, by using a plurality of output nodes, it is possible to reduce the number of pieces of time-series data acquired from one output node and to enhance the learning performance. Furthermore, if a failure occurs in one path while performing the learning and testing using a plurality of paths from a plurality of output nodes, the reservoir computing system 200 may continue the learning and testing by using paths excluding this one path.

In the manner described above, the reservoir computing system 100 and the reservoir computing system 200 according to the present embodiment may be operable to realize a physical system having nonlinear dynamics as the reservoir 130. For example, a semiconductor laser has a nonlinear oscillation characteristic or has a nonlinear characteristic that is further strengthened according to outside disturbances or the like, and can therefore be used as the reservoir 130. The following describes an example of a reservoir 130 using a semiconductor laser.

FIG. 8 shows a first exemplary configuration of the reservoir 130 according to the present embodiment. FIG. 8 shows an example in which the reservoir 130 is a semiconductor laser formed on a substrate. The reservoir 130 includes a substrate 410, a semiconductor laser 420, a waveguide 430, a mirror 440, a photodetection section 450, and an AD converting section 460.

The substrate 410 may be a semiconductor substrate. The substrate 410 is preferably a substrate operable to form a semiconductor laser. For example, the substrate 410 is a silicon substrate. The substrate 410 may be a compound substrate. The semiconductor laser 420 may be operable to output laser light in response to having current injected thereto. The semiconductor laser 420 may be operable to be formed on the substrate 410. The semiconductor laser 420 is a DFB (Distribution Feedback) laser, for example.

The waveguide 430 is formed on the substrate 410, and may be operable to propagate laser light that is output by the semiconductor laser 420 to the photodetection section 450. The waveguide 430 may be a silicon waveguide formed in a silicon substrate. The mirror 440 is provided in the waveguide 430 and may be operable to reflect a positon of the laser light output by the semiconductor laser 420. The mirror 440 may be operable to function as a half-mirror that reflects a portion of the laser light toward this semiconductor laser 420 and transparently passes the remaining portion in a manner to propagate to the photodetection section 450.

The mirror 440 may be a Bragg reflective mirror formed in a silicon waveguide. In this case, the mirror 440 may be operable to have the reflectivity thereof adjusted by having current injected thereto.

The photodetection section 450 may be operable to receive the laser light output from the waveguide 430. The photodetection section 450 may be operable to output an electrical signal corresponding to the intensity of the received laser light. The photodetection section 450 may be operable to output an electrical signal corresponding to fluctuation over time of the laser light output. The photodetection section 450 may be a photodiode or the like.

The AD converting section 460 may be operable to convert the electrical signal output by the photodetection section 450 into a digital signal. The AD converting section 460 may convert the electrical signal input thereto into a digital signal at substantially constant predetermined time intervals, according to a clock signal or the like. The AD converting section 460 may include an AD converter of a type such as sequential comparison, flash, pipeline, or digital. For example, the AD converting section 460 may include circuit elements of a MOS structure formed on a silicon substrate or the like.

The semiconductor laser 420 and the waveguide 430 described above may be formed integrally on the substrate 410. Furthermore, the semiconductor laser 420, the waveguide 430, and the mirror 440 are preferably formed integrally on the substrate 410. For example, the semiconductor laser 420, the waveguide 430, and the mirror 440 are formed by applying machining such as etching, deposition, or the like to a silicon substrate. The photodetection section 450 may also be formed integrally on the substrate 410. Furthermore, the AD converting section 460 may also be formed integrally on the substrate 410.

The reservoir 130 of the first exemplary configuration described above may output a response that is nonlinear with respect to the time axis, using the semiconductor laser 420 that has a feedback function due to the mirror 440. Specifically, the semiconductor laser 420 may be operable to perform laser oscillation according to a current injected thereto, while receiving external disturbances due to feedback light caused by the mirror 440. Due to such external feedback, the semiconductor laser 420 preferably causes the intensity of the output light to have a time waveform that vibrates self-excitedly, even when the position and reflectivity of the mirror 440 are substantially constant.

Furthermore, the reservoir 130 according to the first exemplary configuration may be operable to output a more complex time response by modulating the position and/or reflectivity of the mirror 440. For example, if a plate-shaped mirror 440 is provided, the reservoir 130 may perform modulation by moving the position of this mirror 440 with an actuator or the like. Furthermore, if a Bragg reflection mirror is provided as the mirror 440, the reservoir 130 may modulate the current injected into the Bragg reflection mirror. Alternatively, the reservoir 130 may modulate the current injected into the semiconductor laser 420.

In this way, the reservoir 130 of the first exemplary configuration can modulate the light output of the laser light input to the photodetection section 450 in a temporally complex manner, and can therefore be adopted in a reservoir computing system 100. For example, the reservoir 130 supplies each of the output nodes 20 corresponding to the output layer 140 shown in FIG. 1 with time-series digital signals $S_1$ to $S_n$ output by the photodetection section 450 at timings from $t_1$ to $t_n$. In this way, the reservoir 130 of the first exemplary configuration can operate as the reservoir 130 of the reservoir computing system 100 shown in FIG. 1.

Furthermore, as an example, the reservoir 130 of the first exemplary configuration supplies the output node 22 of the output layer 210 shown in FIG. 2 with a time-series digital signal sequence ($S_1$, $S_2$, ..., $S_n$) output by the photodetection section 450 at the timings from $t_1$ to $t_n$. In this way, the reservoir 130 of the first exemplary configuration can operate as the reservoir 130 of the reservoir computing system 200 shown in FIG. 2.

The reservoir 130 of the first exemplary configuration described above can lengthen the delay time for inputting the external feedback light as the distance D between the semiconductor laser 420 and the mirror 440 becomes longer, and can therefore output a more complex time response. However, if the semiconductor laser 420 and the mirror 440 are formed integrally on the substrate 410 that is made of silicon or the like, for example, it is difficult to perform manufacturing stably by separating the semiconductor laser 420 and the mirror 440 by a distance D of approximately several centimeters. In other words, it is possible to achieve miniaturization by forming these components integrally in the reservoir 130, but the distance D is more than 1 cm and it is difficult to make the delay time greater than or equal to approximately 10 ps.

Furthermore, the semiconductor laser 420 and the mirror 440 can be formed independently and further separated by a distance D, but the reservoir 130 increases in size by this separation distance. Furthermore, if the semiconductor laser 420 and the mirror 440 are formed independently, a precise adjustment of the optical axis is necessary, and this increases the manufacturing cost. The following describes a reservoir 130 that enables lengthening of the distance D without performing a precise adjustment of the optical axis.

FIG. 9 shows a second exemplary configuration of the reservoir 130 according to the present embodiment. FIG. 9 shows an example in which the reservoir 130 is a laser apparatus using optical fiber. In the reservoir 130 of the second exemplary configuration, components having substantially the same operation as components of the reservoir 130 of the first exemplary configuration shown in FIG. 8 are given the same reference numerals, and descriptions thereof are omitted. The reservoir 130 includes a semiconductor laser 420, a photodetection section 450, an AD converting section 460, optical fiber 470, an optical circulator 480, and an optical coupler 490.

The semiconductor laser 420 of the second exemplary configuration may be operable to output laser light to the optical fiber 470. The semiconductor laser 420 may be a device with a fiber pigtail attached thereto. The optical fiber 470 is provided between each device and may be operable to propagate the laser light. For example, the optical fiber 470 is provided between the semiconductor laser 420 and the optical circulator 480. Furthermore, the optical fiber 470 is provided between the optical circulator 480 and the optical coupler 490.

The optical circulator 480 may be a three-port type of optical circulator that includes a first port 482, a second port 484, and a third port 486. As an example, the optical circulator 480 outputs the light input to the first port 482 from the second port 484 and outputs the light input to the second port 484 from the third port 486. FIG. 9 shows an example in which the second port 484 of the optical circulator 480 is connected to the semiconductor laser 420, the light input to the first port 482 is supplied to the semiconductor laser 420, and the laser light output from the semiconductor laser 420 is output from the third port 486.

The optical coupler 490 may be a one-input two-output optical coupler that includes a first input 492, a second output 494, and a third output 496. The optical coupler 490 may cause the light input thereto to be split or combined. FIG. 9 shows an example in which the light input from the first input 492 by the optical coupler 490 is split to the second output 494 and the third output 496. The optical coupler 490 may output the laser light from the second output 494 to the photodetection section 450. Furthermore, the reservoir 130 may supply the semiconductor laser 420 with the laser light output from the third output 496 of the optical coupler 490 as the external feedback light.

The reservoir 130 of the second exemplary configuration described above may have the optical coupler 490 output a portion of the laser light output from the semiconductor laser 420 to the outside and feed the remaining portion of the laser light back to the semiconductor laser 420. The reservoir 130 of the second exemplary configuration may have the optical fiber 470 provided between the semiconductor laser 420 and the optical circulator 480 and between the optical circulator 480 and the optical coupler 490. Specifically, the delay time for inputting the external feedback light to the semiconductor laser 420 can be easily adjusted according to the length of the optical fiber 470.

For example, it is possible to set the length of the optical fiber 470 to be from approximately 10 cm to approximately several kilometers. In this way, the reservoir 130 of the second exemplary configuration can realize a longer delay time at a lower cost compared to the reservoir 130 of the first exemplary configuration. Due to such external feedback light, the reservoir 130 can output a response that is non-linear with respect to the time axis. Specifically, the semiconductor laser 420 can cause the intensity of the output light to have a time waveform that vibrates self-excitedly due to the external feedback light, even when the splitting ratio of the optical coupler 490 is substantially constant.

In this way, the reservoir 130 of the second exemplary configuration can cause the light output of the laser light input to the photodetection section 450 to fluctuate in a temporally complex manner, and can therefore be adopted in a reservoir computing system 100, in the same manner as the reservoir 130 of the first exemplary configuration. However, since the devices such as the semiconductor laser 420, the photodetection section 450, the AD converting section 460, the optical circulator 480, and the optical coupler 490 are provided independently, the reservoir 130 of the second exemplary configuration has a larger size than the reservoir 130 of the first exemplary configuration.

Therefore, in the present embodiment, a reservoir 130 is described that can reduce the cost and further lengthen the distance D, without increasing the size. Such a reservoir 130 may include a laser apparatus 500 such as shown in FIG. 10.

Figure 10:
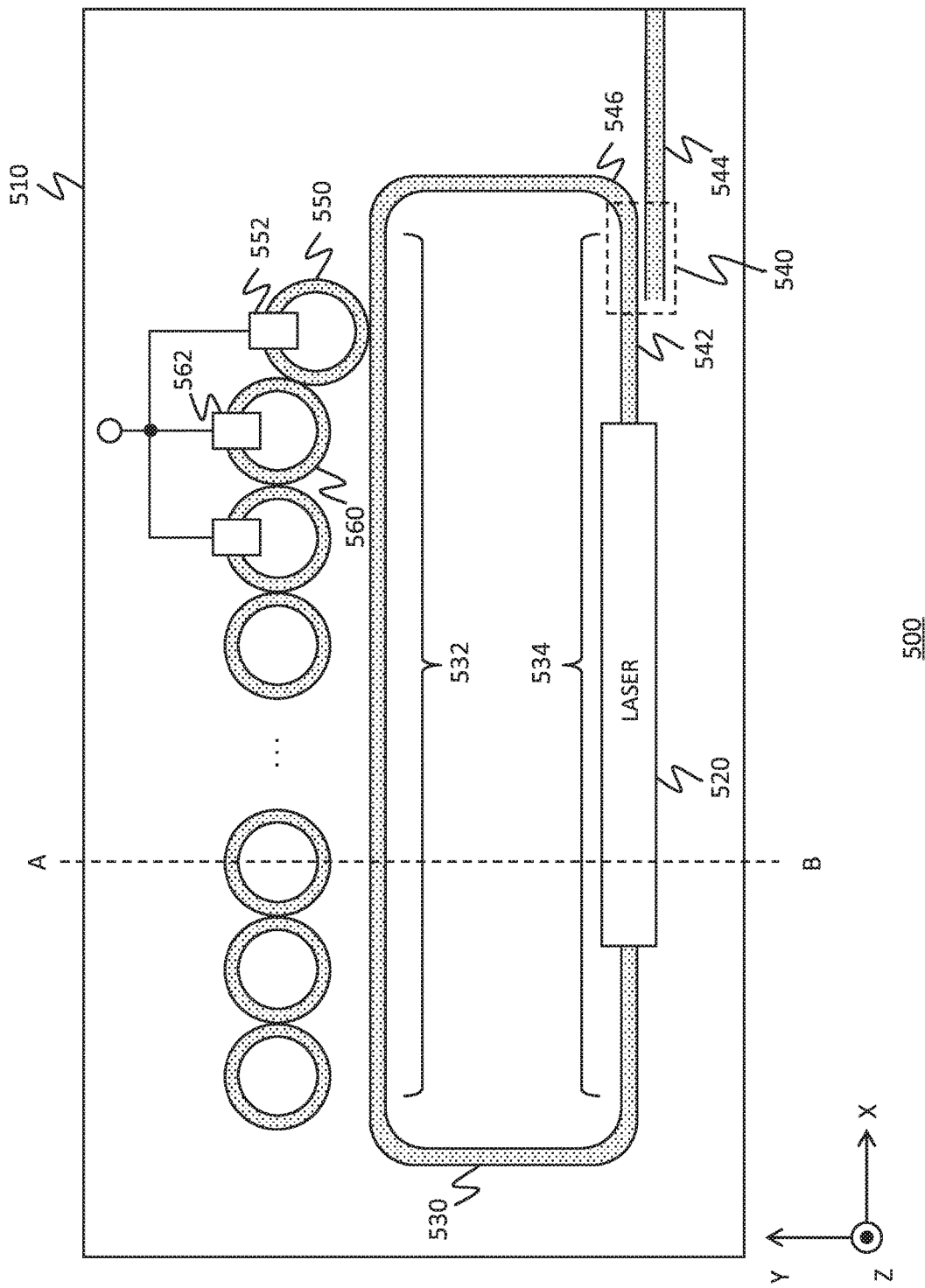
FIG. 10 shows an exemplary configuration of the laser apparatus 500 according to the present embodiment.

FIG. 10 shows an exemplary configuration of the laser apparatus 500 according to the present embodiment. The laser apparatus 500 further lengthens the delay time of the external feedback light to the laser oscillation source by causing the laser light to propagate in a ring resonator. The laser apparatus 500 includes a substrate 510, a laser 520, a feedback waveguide 530, an optical splitter 540, a first ring resonator 550, and a second ring resonator 560.

The substrate 510 may be a semiconductor substrate. The substrate 510 is preferably a substrate operable to form a semiconductor laser or the like. The substrate 510 may be a silicon-based substrate. The substrate 510 may be one of a silicon substrate, a compound semiconductor substrate, a glass substrate, a ceramic substrate, and the like. FIG. 10 shows an exemplary configuration in the XY plane that is substantially parallel to the front surface of the substrate 510. The substrate 510 may have optical elements and the like formed thereon by having machining such as deposition, burying, etching, or the like applied thereto in the Z direction, which is substantially perpendicular to the front surface.

The laser 520 may be operable to output laser light in response to current injected thereto. The laser 520 may be a semiconductor laser that is operable to be formed on the substrate 510. For example, the laser 520 is a DFB (Distribution Feedback) laser. In this case, the laser 520 may be operable to be formed with a length from substantially 100 µm to substantially 1 mm in a first direction on the substrate 510. The laser 520 is preferably formed with a length of approximately several hundred micrometers in the first direction. Furthermore, the laser 520 may be operable to be formed with a length from substantially 10 µm to substantially tens of micrometers in a second direction that is orthogonal to the first direction on the substrate 510. The laser 520 is preferably formed with a length of tens of micrometers in the second direction. The example in FIG. 10 uses the X direction as the first direction and the Y direction as the second direction.

The feedback waveguide 530 may be operable to feed the light output from the laser 520 back to the laser 520. The feedback waveguide 530 may be operable to propagate the laser light output from one end of the laser 520 to the other end of the laser 520. For example, the feedback waveguide 530 propagates the light output from one edge of the laser 520 to another edge. The feedback waveguide 530 may be operable to be formed on the substrate 510. If the substrate 510 is a silicon substrate, the feedback waveguide 530 may be a silicon waveguide path formed on this silicon substrate.

The feedback waveguide 530 may have an elliptical or ovular shape on the front surface of the substrate 510. The feedback waveguide 530 may have a loop shape with a length in the second direction, which is perpendicular to the first direction, that is less than the length in the first direction. In this case, the feedback waveguide 530 may include a first linear portion 532 and a second linear portion 534 as a part of this loop shape. The first linear portion 532 may be a portion of the loop shape that extends in the first direction. The second linear portion 534 may be a portion of the loop shape of the feedback waveguide 530 that extends in the first direction on the opposite side from the first linear portion 532.

FIG. 10 shows an example in which the laser 520 is arranged in the second linear portion 534 of the feedback waveguide 530. The loop length of the feedback waveguide 530 may be operable to be formed to be from hundreds of micrometers to several centimeters or more. The loop length of the feedback waveguide 530 is preferably formed to be approximately several millimeters.

The optical splitter 540 is provided in the path of the feedback waveguide 530, and may be operable to output a portion of the light propagated by the feedback waveguide 530 to the outside of the substrate 510. FIG. 10 shows an example in which the optical splitter 540 is arranged in the second linear portion 534 of the feedback waveguide 530. The optical splitter 540 may be a one-input two-output optical coupler that has a first input 542, a second output 544, and a third output 546. The optical splitter 540 may split the light input from the first input 542 to the second output 544 and the third output 546. FIG. 10 shows an example in which the optical splitter 540 outputs a portion of the light input from the first input 542 to the outside from the second output 544, and outputs the remaining portion of the light from the third output 546 to the first linear portion 532.

The first ring resonator 550 may be operable to optically connect to the feedback waveguide 530. The first ring resonator 550 is optically connected to the feedback waveguide 530, and may be operable to input a portion of the laser light output from the laser 520 from the optical connection portion, and to cause this light to circulate within the first ring resonator 550. Furthermore, the first ring resonator 550 may return a portion of the laser light that has been circulated in the resonator to the feedback waveguide 530. The first ring resonator 550 may return the laser light to the feedback waveguide 530 one portion at a time, every time the laser light makes a circulation. In this way, the first ring resonator 550 can function as a delay element that delays the time according to the distance that the laser light has circulated.

The first ring resonator 550 may be formed with a loop shape on the front surface of the substrate 510. For example, the first ring resonator 550 may have a shape that is circular, elliptical, ovular, or the like. The loop length of the first ring resonator 550 may be less than the loop length of the feedback waveguide 530. The first ring resonator 550 preferably has a diameter that is greater than or equal to approximately 10 µm and less than or equal to hundreds of micrometers. The first ring resonator 550 more preferably has a diameter that is greater than or equal to approximately 10 µm and less than or equal to 100 µm. The first ring resonator 550 may be formed of substantially the same material as the feedback waveguide 530.

The first ring resonator 550 may be arranged in the first linear portion 532 of the feedback waveguide 530, for example. In this case, the optical splitter 540 may be arranged in the feedback waveguide 530 between the output of the laser 520 and the optical connection portion connecting to the first ring resonator 550. The first ring resonator 550 may include an electrode 552.

The electrode 552 may be operable to control the first ring resonator 550. For example, the electrode 552 changes the refractive index n of the silicon crystal by injecting current thereto. Accordingly, if the substrate 510 is a silicon substrate, the electrode 552 is formed on a portion of the light waveguide of the first ring resonator 550, and the electrode 552 can change the velocity v=c/n of the light being propagated in the first ring resonator 550 by injecting the current. Specifically, if the laser apparatus 500 includes the electrode 552, the electrode 552 can be made operable to adjust the wavelength of the light being circulated in the first ring resonator 550 by having current applied to the electrode 552 from the outside.

One or more of the second ring resonators 560 may be provided. Each of the one or more second ring resonators 560 may be operable to optically connect to the first ring resonator 550 either directly or indirectly via another of the second ring resonators 560. FIG. 10 shows an example in which a plurality of the second ring resonators 560 are provided. The plurality of second ring resonators 560 may be optically connected in series.

FIG. 10 shows an example in which the second ring resonator 560 that is positioned at a first end, among the plurality of second ring resonators 560, is optically connected to the first ring resonator 550. The plurality of second ring resonators 560 may be arranged in a first direction, which is a direction away from the first ring resonator 550, from the second ring resonator 560 at the first end. In other words, the plurality of second ring resonators 560 may be arranged along the first linear portion 532.

Each second ring resonator 560 may be formed with a loop shape on the front surface of the substrate 510. Each second ring resonator 560 may have a shape that is circular, elliptical, ovular, or the like, for example. The loop length of each second ring resonator 560 may be less than the loop length of the feedback waveguide 530. Each second ring resonator 560 preferably has a diameter that is greater than or equal to approximately 10 µm and less than or equal to hundreds of micrometers. Each second ring resonator 560 more preferably has a diameter that is greater than or equal to approximately 10 µm and less than or equal to 100 µm. Each second ring resonator 560 preferably has substantially the same shape as the first ring resonator 550. Each second ring resonator 560 may be formed of substantially the same material as the feedback waveguide 530. Some or all of the second ring resonators 560 may include an electrode 562.

The electrode 562 may be operable to control the resonance of the corresponding second ring resonator 560, in the same manner as the electrode 552 of the first ring resonator 550. Specifically, if the laser apparatus 500 includes one or more electrodes 562, the laser apparatus 500 can be made operable to adjust the wavelength of the light being circulated in the second ring resonator 560 in which the electrode 562 is formed, by supplying a current to the electrode 562 from the outside. The laser apparatus 500 may include such an electrode in at least one of the first ring resonator 550 and the one or more second ring resonators 560. If the laser apparatus 500 is used as the reservoir 130, the input signal may be input to such an electrode. Specifically, the input node 10 of the input layer 110 may be operable to supply the electrode with the input signal corresponding to the input data.

The second ring resonator 560 that is optically connected to the first ring resonator 550 may circulate a portion of the laser light that is circulated in the first ring resonator 550. The second ring resonator 560 may supply a portion of the laser light being circulated to an adjacent second ring resonator 560 connected thereto in series. Furthermore, the second ring resonator 560 may return a portion of the remaining laser light being circulated to the first ring resonator 550. The second ring resonator 560 optically connected to the first ring resonator 550 may supply a portion of the laser light being circulated to each of the adjacent second ring resonator 560 and the first ring resonator 550, every time the laser light makes a circulation.

In the same manner, each second ring resonator 560 may sequentially circulate the laser light, in order of the serial connection from the first ring resonator 550. Furthermore, each second ring resonator 560 may supply each of the two adjacent second ring resonators 560 with a portion of the laser light being circulated. In this way, the laser light input to the first ring resonator 550 from the feedback waveguide 530 passes through each of a plurality of paths that cause one circulation and a plurality of circulations in the first ring resonator 550 and a plurality of paths that cause various circulations in the plurality of second ring resonators 560, and again returns to the feedback waveguide 530.

In other words, the laser apparatus 500 can supply the laser 520 with laser light having various delay times, as the external feedback light. Furthermore, the laser apparatus 500 can include, in the external feedback light, laser light that has made a plurality of circulations in the first ring resonator 550 and the one or more second ring resonators 560. Accordingly, the laser apparatus 500 can supply the laser 520 with laser light that has been delayed by a time exceeding 1 ns, for example, as the external feedback light.

Here, the laser 520, the feedback waveguide 530, the optical splitter 540, and the first ring resonator 550 may be operable to be formed on the same substrate 510. Furthermore, the second ring resonators 560 may be operable to be formed on the substrate 510. In other words, the laser apparatus 500 may be formed integrally with the silicon substrate. In this way, the laser apparatus 500 can have a length in the first direction that is less than or equal to approximately 1 mm and a length in the second direction of approximately hundreds of micrometers, which is smaller than the length in the first direction, for example.

As an example, a case is considered in which the laser apparatus 500 has the laser 520 with a length of approximately 500 µm in the first direction and the feedback waveguide 530 with a loop length of approximately 1 mm formed on the substrate 510. In this case as well, by providing a total of approximately ten resonators including the first ring resonator 550 and the plurality of second ring resonators 560, the laser apparatus 500 can generate external feedback light having a delay time of approximately 1 ns, which is equivalent to a resonator length of substantially 30 cm. The diameter of each of the first ring resonator 550 and the plurality of second ring resonators 560 may be approximately 40 µm.

In the manner described above, the laser apparatus 500 according to the present embodiment can realize a feedback path that is 100 times or more longer when compared to the size of the apparatus, with a small size and at low cost. Accordingly, the laser apparatus 500 can function as the reservoir 130 by supplying the photodetection section 450 with the output laser light and converting the result into a digital signal using the AD converting section 460, in the same manner as described in FIG. 8 and FIG. 9.

Figure 11:
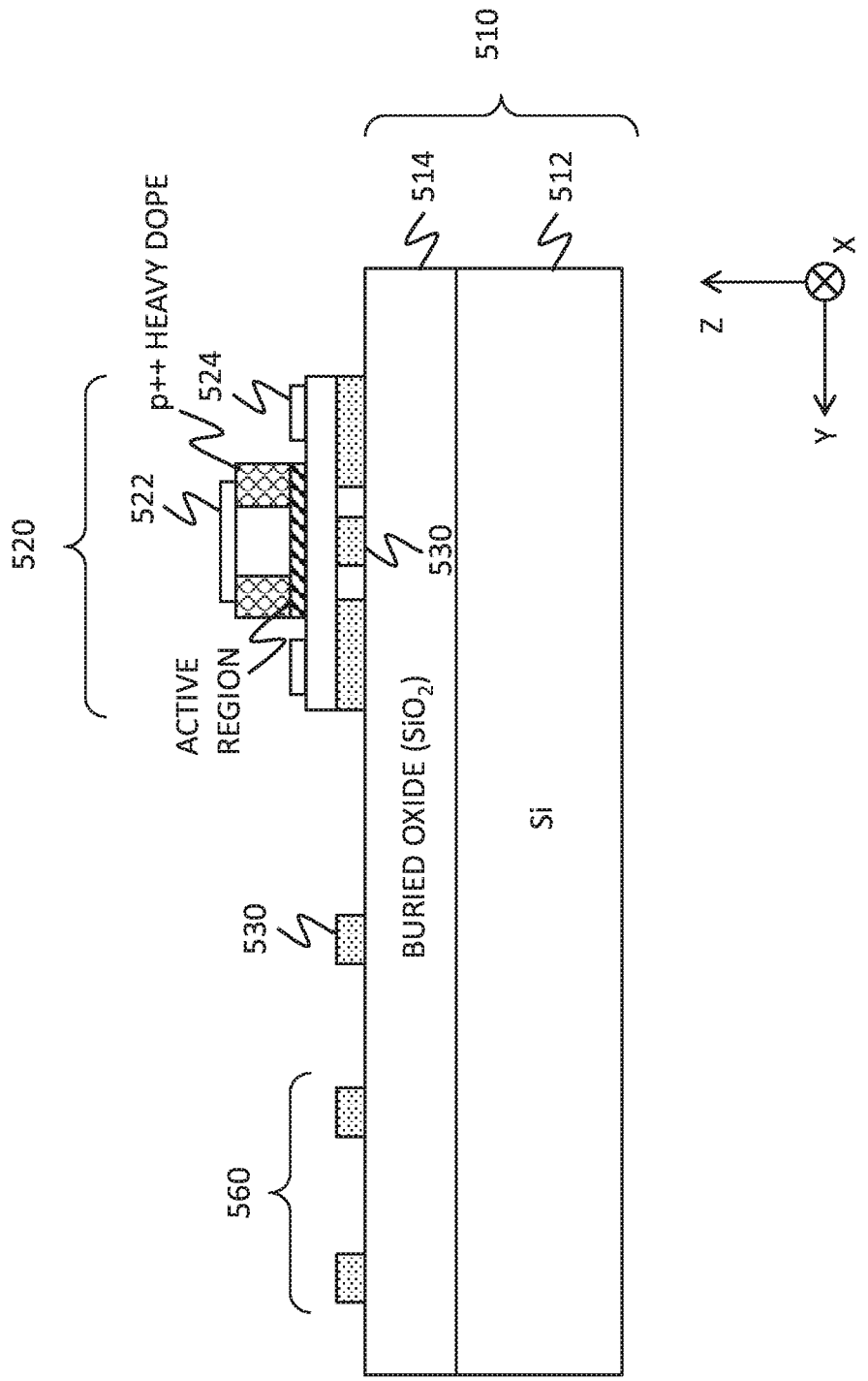
FIG. 11 shows an exemplary configuration of a cross section of the laser apparatus 500 shown in FIG. 10 across the line A-B.

FIG. 11 shows an exemplary configuration of a cross section of the laser apparatus 500 shown in FIG. 10 across the line A-B. The substrate 510 may include a silicon substrate 512 and a silicon oxide film 514. Specifically, FIG. 11 shows an example in which the laser 520, the feedback waveguide 530, the optical splitter 540, the first ring resonator 550, and the second ring resonators 560 are formed on the silicon oxide film 514 of the substrate 510.

The laser 520 may be a semiconductor laser formed by a group III-V compound semiconductor. The laser 520 may include a first electrode 522 and a second electrode 524. The laser 520 can output laser light from an active region, by having current injected between the first electrode 522 and the second electrode 524. Furthermore, the feedback waveguide 530, the optical splitter 540, the first ring resonator 550, and the second ring resonators 560 may be made of silicon crystal or the like and formed on the silicon oxide film 514 of the substrate 510. The following uses FIG. 12 and FIG. 13 to describe the light output of such a laser apparatus 500.

Figure 12:
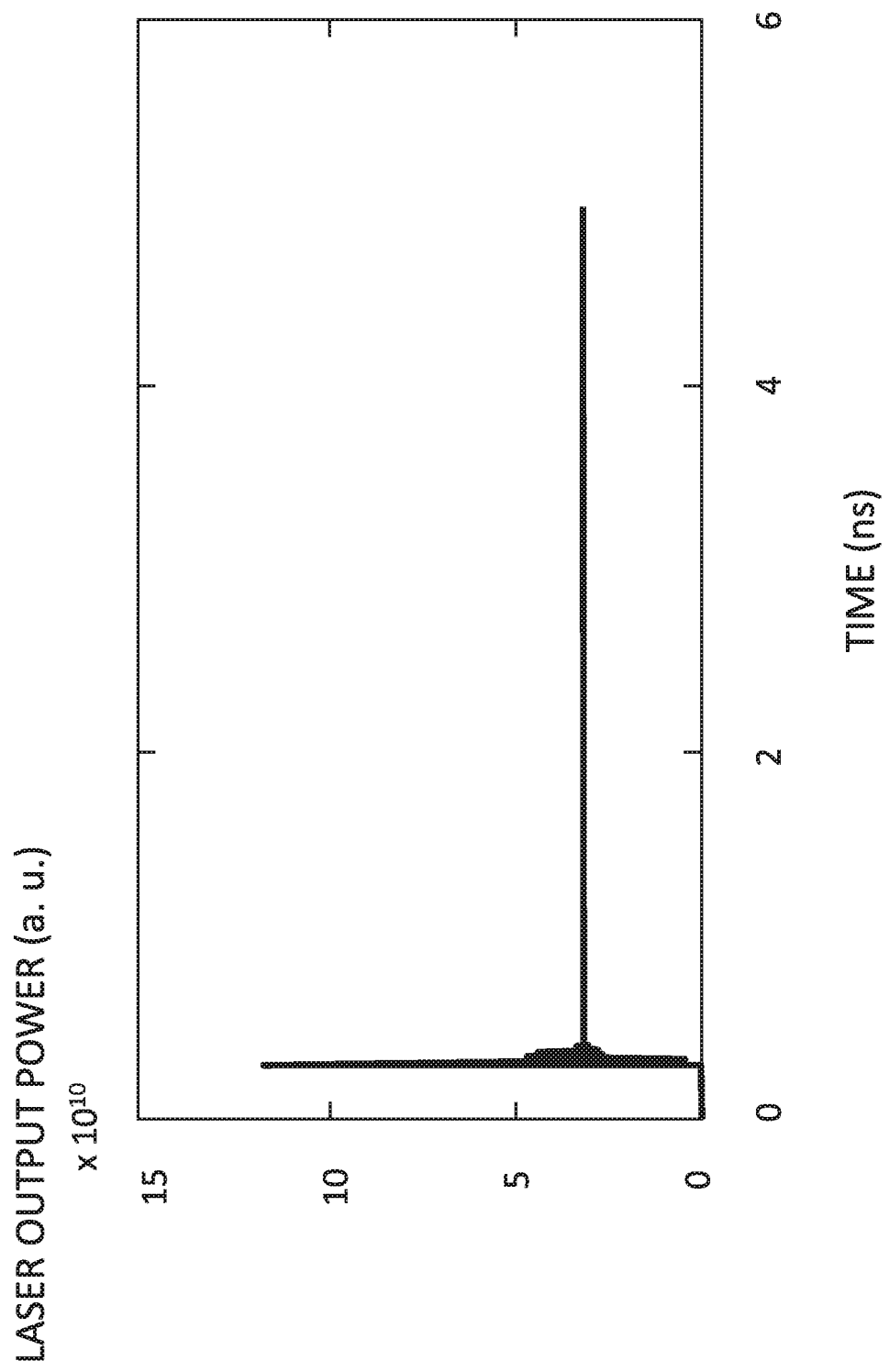
FIG. 12 shows an example of the light output characteristic of a laser apparatus serving as a comparison target.

FIG. 12 shows an example of the light output characteristic of a laser apparatus serving as a comparison target. The laser apparatus serving as a comparison target is a laser apparatus with a configuration obtained by removing the first ring resonator 550 and the second ring resonators 560 from the laser apparatus 500 shown in FIG. 10 and FIG. 11. Specifically, the laser apparatus serving as the comparison target is an example of a laser apparatus that has a feedback loop of approximately 1 mm. In FIG. 12, the horizontal axis indicates time and the vertical axis indicates the relative value of the optical power. It should be noted that FIG. 12 shows an example of calculation results obtained through a simulation.

The laser apparatus serving as the comparison target begins laser oscillation when current is injected and an inverse distribution is formed. The laser apparatus serving as the comparison target begins nonlinear laser oscillation in which the optical power vibrates. However, since the delay of the external feedback light is short in the laser apparatus serving as the comparison target, the amplitude of the vibration of the optical power eventually becomes small when this delay time has passed, and the laser apparatus serving as the comparison target outputs a substantially constant optical power.

Figure 13:
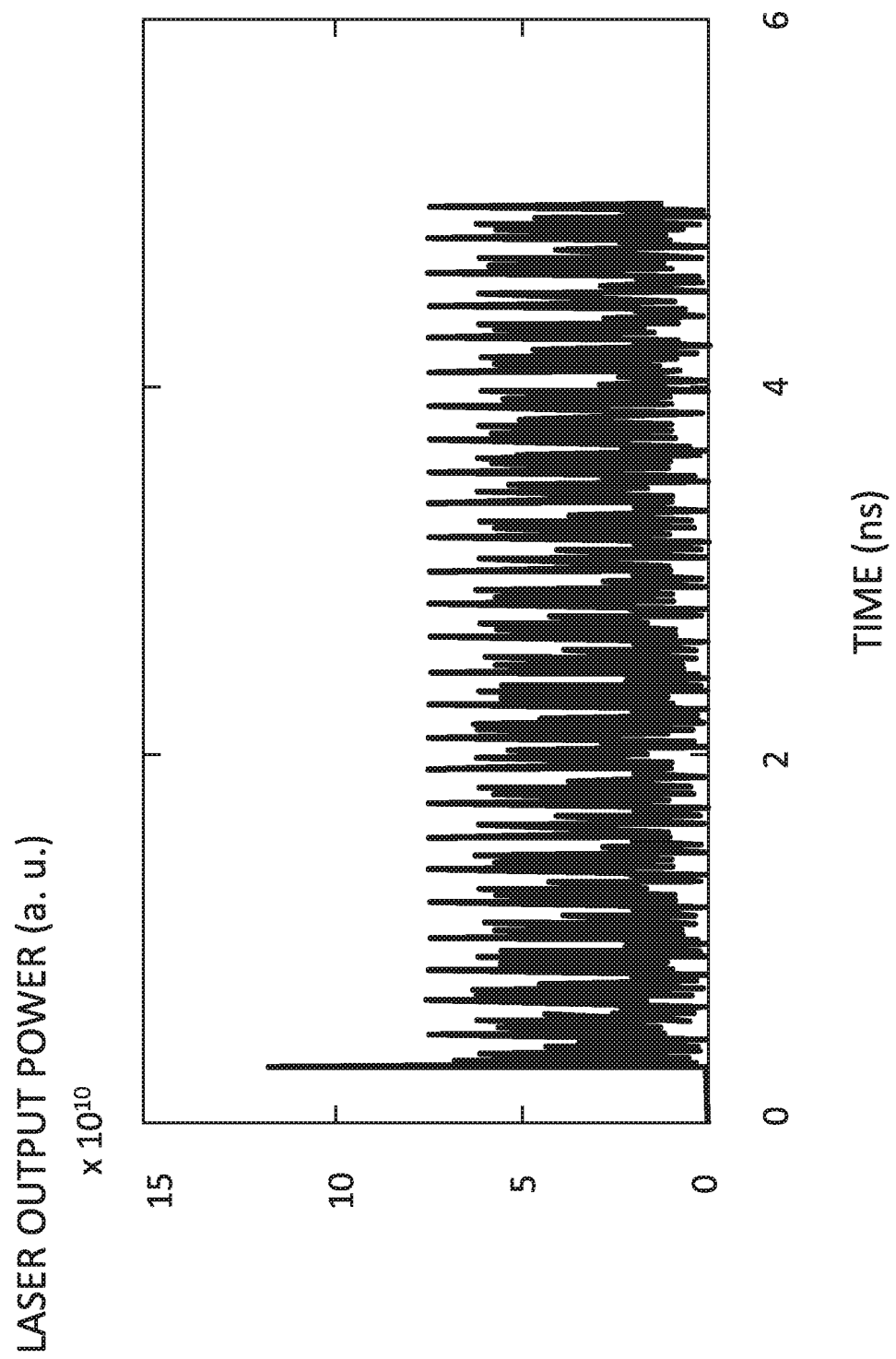
FIG. 13 shows an example of the light output characteristic of the laser apparatus 500 according to the present embodiment.

FIG. 13 shows an example of the light output characteristic of the laser apparatus 500 according to the present embodiment. The laser apparatus 500 may have substantially the same configuration as the laser apparatus 500 shown in FIG. 10 and FIG. 11. In FIG. 13, the horizontal axis indicates time and the vertical axis indicates the relative value of the optical power. It should be noted that FIG. 13 shows an example of calculation results obtained through a simulation, in the same manner as in FIG. 12.

The laser apparatus 500 begins laser oscillation when current is injected and an inverse distribution is formed. The laser apparatus 500 begins nonlinear laser oscillation in which the optical power vibrates. It is understood that since the external feedback light includes a delay time exceeding 1 ns, the laser apparatus 500 continues the vibration of the optical power and a nonlinear input/output response is maintained. In the manner described above, the laser apparatus 500 according to the present embodiment can continue the nonlinear input/output response, and can therefore be used as the reservoir 130 of the reservoir computing system 100 and the reservoir computing system 200 according to the present embodiment.

The laser apparatus 500 according to the present embodiment described above is an example in which the second ring resonators 560 are arranged in series in the first direction. Here, among the plurality of second ring resonators 560 arranged in series, the second ring resonator 560 at one end may be optically connected to the first ring resonator 550, and the second ring resonator 560 at the other end may be optically connected to the first linear portion 532 of the feedback waveguide 530. Furthermore, a portion of the plurality of second ring resonators 560 may branch. The laser apparatus 500 may generate a longer time delay by forming the plurality of second ring resonators 560 with more complex paths.

The laser apparatus 500 according to the present embodiment is described as an example including the first ring resonator 550 and the second ring resonators 560, but the present invention is not limited to this. The laser apparatus 500 may include only the first ring resonator 550.

The laser apparatus 500 may further include an optical amplifier, light switching element, or the like between the first ring resonator 550 and the laser 520 in the feedback waveguide 530. The optical amplifier, the light switching element, or the like may be operable to operate according to a control signal from the outside. If the delay time of the external feedback light returning from the first ring resonator 550 is less than 100 ps, for example, the optical amplifier, the light switching element, or the like may be controlled to be in the OFF state such that this external feedback light does not reach the laser 520.

Furthermore, if the delay time of the external feedback light returning from the first ring resonator 550 is greater than or equal to 100 ps, for example, the optical amplifier, the light switching element, or the like may be controlled to be in the ON state such that this external feedback light reaches the laser 520. In this way, the laser apparatus 500 can supply the laser 520 with the external feedback light having a delay time that is greater than or equal to a predetermined delay time.

Figure 14:
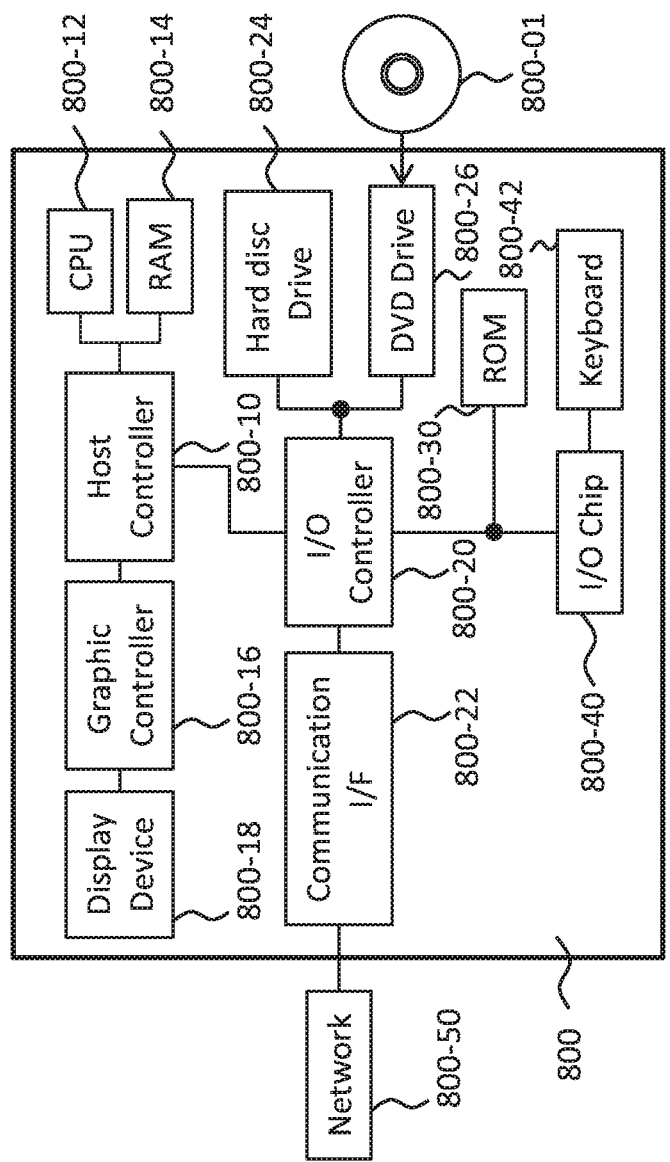
FIG. 14 shows an exemplary hardware configuration of a computer according to the embodiment of the invention.

FIG. 14 shows an exemplary hardware configuration of a computer according to the embodiment of the invention. A program that is installed in the computer 800 can cause the computer 800 to function as or perform operations associated with apparatuses of the embodiments of the present invention or one or more sections (including modules, components, elements, etc.) thereof, and/or cause the computer 800 to perform processes of the embodiments of the present invention or steps thereof. Such a program may be executed by the CPU 800-12 to cause the computer 800 to perform certain operations associated with some or all of the blocks of flowcharts and block diagrams described herein.

The computer 800 according to the present embodiment includes a CPU 800-12, a RAM 800-14, a graphics controller 800-16, and a display device 800-18, which are mutually connected by a host controller 800-10. The computer 800 also includes input/output units such as a communication interface 800-22, a hard disk drive 800-24, a DVD-ROM drive 800-26 and an IC card drive, which are connected to the host controller 800-10 via an input/output controller 800-20. The computer also includes legacy input/output units such as a ROM 800-30 and a keyboard 800-42, which are connected to the input/output controller 800-20 through an input/output chip 800-40.

The CPU 800-12 operates according to programs stored in the ROM 800-30 and the RAM 800-14, thereby controlling each unit. The graphics controller 800-16 obtains image data generated by the CPU 800-12 on a frame buffer or the like provided in the RAM 800-14 or in itself, and causes the image data to be displayed on the display device 800-18.

The communication interface 800-22 communicates with other electronic devices via a network 800-50. The hard disk drive 800-24 stores programs and data used by the CPU 800-12 within the computer 800. The DVD-ROM drive 800-26 reads the programs or the data from the DVD-ROM 800-01, and provides the hard disk drive 800-24 with the programs or the data via the RAM 800-14. The IC card drive reads programs and data from an IC card, and/or writes programs and data into the IC card.

The ROM 800-30 stores therein a boot program or the like executed by the computer 800 at the time of activation, and/or a program depending on the hardware of the computer 800. The input/output chip 800-40 may also connect various input/output units via a parallel port, a serial port, a keyboard port, a mouse port, and the like to the input/output controller 800-20.

A program is provided by computer readable media such as the DVD-ROM 800-01 or the IC card. The program is read from the computer readable media, installed into the hard disk drive 800-24, RAM 800-14, or ROM 800-30, which are also examples of computer readable media, and executed by the CPU 800-12. The information processing described in these programs is read into the computer 800, resulting in cooperation between a program and the above-mentioned various types of hardware resources. An apparatus or method may be constituted by realizing the operation or processing of information in accordance with the usage of the computer 800.

For example, when communication is performed between the computer 800 and an external device, the CPU 800-12 may execute a communication program loaded onto the RAM 800-14 to instruct communication processing to the communication interface 800-22, based on the processing described in the communication program. The communication interface 800-22, under control of the CPU 800-12, reads transmission data stored on a transmission buffering region provided in a recording medium such as the RAM 800-14, the hard disk drive 800-24, the DVD-ROM 800-01, or the IC card, and transmits the read transmission data to network 800-50 or writes reception data received from network 800-50 to a reception buffering region or the like provided on the recording medium.

In addition, the CPU 800-12 may cause all or a necessary portion of a file or a database to be read into the RAM 800-14, the file or the database having been stored in an external recording medium such as the hard disk drive 800-24, the DVD-ROM drive 800-26 (DVD-ROM 800-01), the IC card, etc., and perform various types of processing on the data on the RAM 800-14. The CPU 800-12 may then write back the processed data to the external recording medium.

Various types of information, such as various types of programs, data, tables, and databases, may be stored in the recording medium to undergo information processing. The CPU 800-12 may perform various types of processing on the data read from the RAM 800-14, which includes various types of operations, processing of information, condition judging, conditional branch, unconditional branch, search/replace of information, etc., as described throughout this disclosure and designated by an instruction sequence of programs, and writes the result back to the RAM 800-14. In addition, the CPU 800-12 may search for information in a file, a database, etc., in the recording medium. For example, when a plurality of entries, each having an attribute value of a first attribute is associated with an attribute value of a second attribute, are stored in the recording medium, the CPU 800-12 may search for an entry matching the condition whose attribute value of the first attribute is designated, from among the plurality of entries, and reads the attribute value of the second attribute stored in the entry, thereby obtaining the attribute value of the second attribute associated with the first attribute satisfying the predetermined condition.

The above-explained program or software modules may be stored in the computer readable media on or near the computer 800. In addition, a recording medium such as a hard disk or a RAM provided in a server system connected to a dedicated communication network or the Internet can be used as the computer readable media, thereby providing the program to the computer 800 via the network.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to individualize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can realize a nonlinear input/output characteristic while achieving a small size and low cost, and can be adopted as a reservoir when a reservoir computing system is implemented as actual hardware.

What is claimed is:

1. A laser apparatus comprising:
    a laser;
    a feedback waveguide that is operable to feed light output from the laser back to the laser;
    an optical splitter that is provided in a path of the feedback waveguide and is operable to output a portion of light propagated in the feedback waveguide to outside the feedback waveguide; and
    a first ring resonator that is operable to be optically connected to the feedback waveguide.

2. The laser apparatus according to claim 1, further comprising:
    one or more second ring resonators, wherein
    each of the one or more second ring resonators is operable to be optically connected to the first ring resonator directly or indirectly via another of the second ring resonators.

3. The laser apparatus according to claim 2, wherein
    a plurality of the second ring resonators are operable to be optically connected in series, and
    the second ring resonator positioned at a first end among the plurality of second ring resonators is operable to be optically connected to the first ring resonator.

4. The laser apparatus according to claim 3, wherein
    the feedback waveguide includes a first linear portion that extends in a first direction, and
    the plurality of second ring resonators are operable to be arranged along the first linear portion.

5. The laser apparatus according to claim 4, wherein
    the feedback waveguide has a loop shape in which a length thereof in a second direction, which is perpendicular to the first direction, is less than a length thereof in the first direction.

6. The laser apparatus according to claim 4, wherein
    the laser is operable to be arranged in a second linear portion that extends in the first direction on a side opposite the first linear portion in the feedback waveguide.

7. The laser apparatus according to claim 2, wherein
    at least one of the first ring resonator and the one or more second ring resonators includes an electrode for controlling resonation.

8. The laser apparatus according to claim 2, wherein
    a loop length of each of the first ring resonator and the one or more second ring resonators is less than a loop length of the feedback waveguide.

9. The laser apparatus according to claim 1, wherein
    the optical splitter is operable to be arranged between an output of the laser and an optical connection portion with the first ring resonator in the feedback waveguide.

10. The laser apparatus according to claim 1, wherein the laser is a distributed feedback laser.

11. The laser apparatus according to claim 1, wherein
    the laser, the feedback waveguide, the optical splitter, and the first ring resonator are operable to be formed on a substrate.

12. The laser apparatus according to claim 11, wherein the substrate is a silicon-based substrate.

\* \* \* \* \*